(12) United States Patent
Montana et al.

(10) Patent No.: US 8,280,698 B2
(45) Date of Patent: Oct. 2, 2012

(54) COMPUTER-IMPLEMENTED METHOD OF COMPUTING, IN A COMPUTER AIDED DESIGN SYSTEM, OF A BOUNDARY OF A MODELED OBJECT

(75) Inventors: Nicolas Montana, Aix-en-Provence (FR); Frédéric Chazal, Marsannay-la-Cote (FR); André Lieutier, Puyricard (FR)

(73) Assignee: Dassauit Systèmes, Velizy Villacoublay (FR)

( * ) Notice: Subject to any disclaimer, the term of this patent is extended or adjusted under 35 U.S.C. 154(b) by 418 days.

(21) Appl. No.: 12/610,016

(22) Filed: Oct. 30, 2009

(65) Prior Publication Data
US 2010/0121626 A1      May 13, 2010

(30) Foreign Application Priority Data

Nov. 7, 2008  (EP) ..................................... 08291047

(51) Int. Cl.
  *G06F 17/50* (2006.01)
(52) U.S. Cl. ........................................... 703/1; 345/420
(58) Field of Classification Search ................ 703/1, 6
  See application file for complete search history.

(56) References Cited

U.S. PATENT DOCUMENTS

| | | | | |
|---|---|---|---|---|
| 5,537,519 | A | * | 7/1996 | Vossler et al. ............... 345/420 |
| 5,566,281 | A | * | 10/1996 | Tokumasu et al. ........... 345/420 |
| 5,850,229 | A | * | 12/1998 | Edelsbrunner et al. ...... 345/473 |
| 7,526,131 | B2 | * | 4/2009 | Weber ........................... 382/199 |

OTHER PUBLICATIONS

Paoluzzi et al, "Dimension-Independent Modeling with Simplicial Complexes", ACM Transactions on Graphics, vol. 12, No. 1, Jan. 1993, pp. 56-102.*
Hildebrandt et al, "On the Convergence of Metric and Geometric Properties of Polyhedral Surfaces", Geom Dedicata, 2006, 123:89-112.*
Ferrucci, V., et al., "Extrusion and Boundary Evaluation for Multidimensional Polyhedra," *Computer-Aided Design*, vol. 23, No. 1, pp. 40-50 (1991).
Lang, V., et al., "Cartesian Product of Simplicial Sets," *Fifth International Conference in Central Europe on Computer Graphics and Visualization*, Plzen, Czech Republic, pp. 1-11 (1997).
European Search Report, for Application/Patent No. 08291047.2-2224, dated Apr. 15, 2009, consisting of 10 pages.
"Real Number," from Wikipedia, http://en.wikipedia.org/wiki/Real_number, 10 pages, Retrieved on May 17, 2012.

* cited by examiner

*Primary Examiner* — Mary C Jacob
(74) *Attorney, Agent, or Firm* — Hamilton, Brook, Smith & Reynolds, P.C.

(57) ABSTRACT

The present invention relates to a computer-implemented method of computing. In one embodiment, computing a boundary of a modelled object in a computer aided design system, the method may include accessing data defining a modeled object as a simplicial m-complex. The method may further include projecting the simplicial m-complex in $\Re^n$, $m \geq n$. The method also may include computing a polyhedral boundary of the modeled object as a polyhedral n−1-cycle in the projection of the simplicial complex. The polyhedral n−1-cycle may substantially border the projection of the simplicial complex. The present invention is further directed to a computer program product and a computerized system for performing the method of the invention.

13 Claims, 18 Drawing Sheets

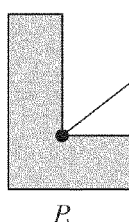
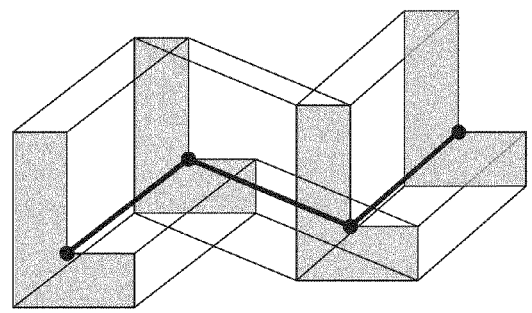
FIG. 11  FIG. 12
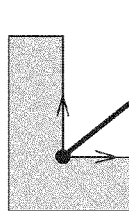
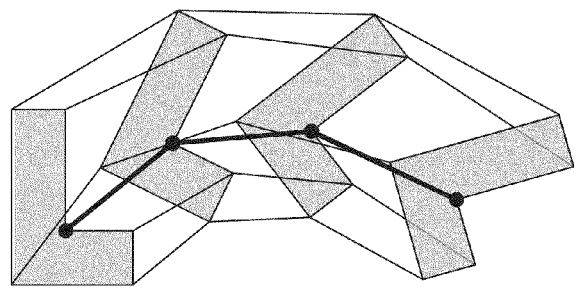
FIG. 13  FIG. 14
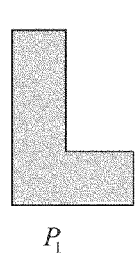
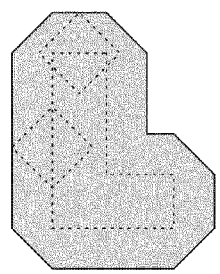
FIG. 15  FIG. 16  FIG. 17

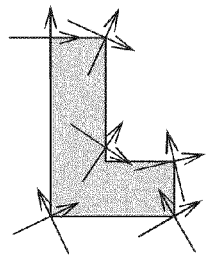
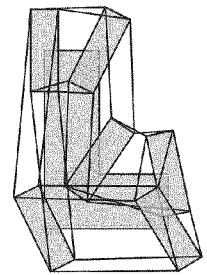
$P_1$  $P_2$
FIG. 18  FIG. 19  FIG. 20
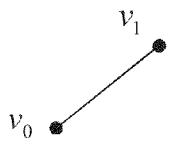
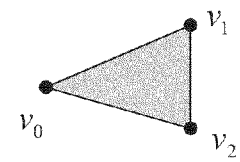
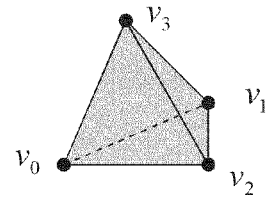
FIG. 21  FIG. 22  FIG. 23  FIG. 24
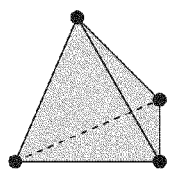
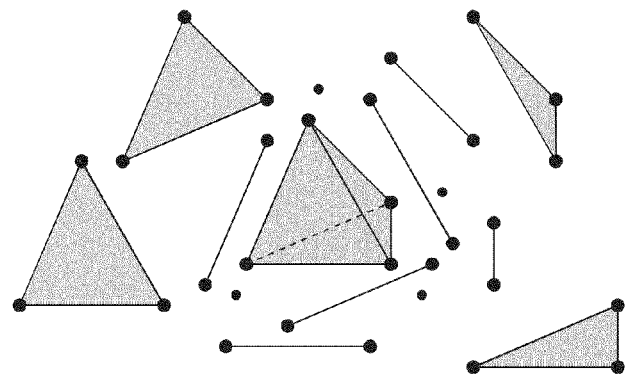
FIG. 25  FIG. 26

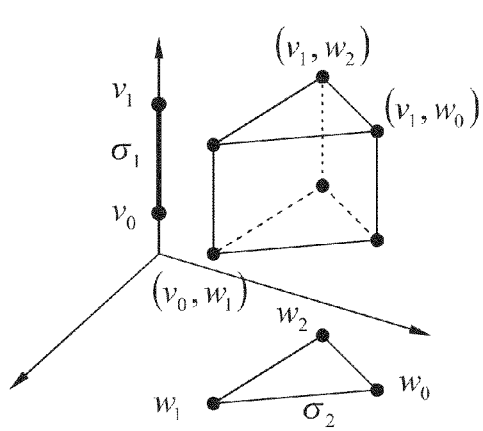 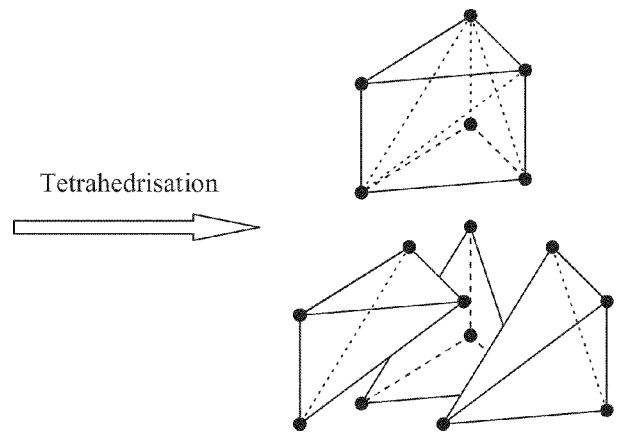
FIG. 33              FIG. 34
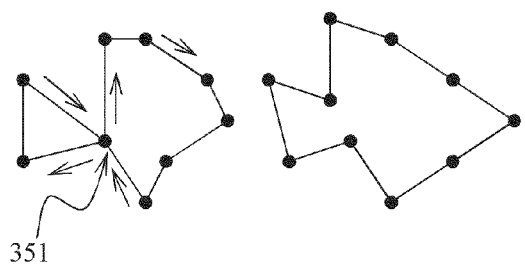 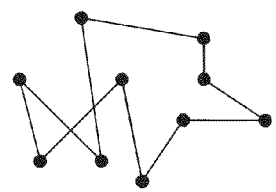
FIG. 35              FIG. 36
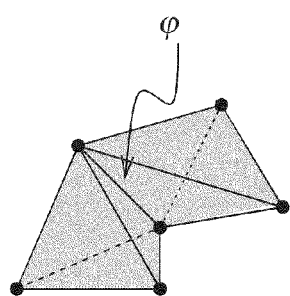 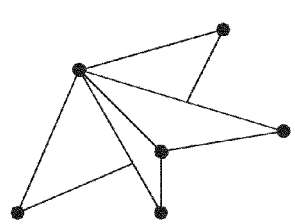 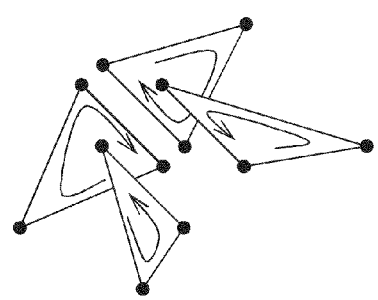
FIG. 37        FIG. 38        FIG. 39

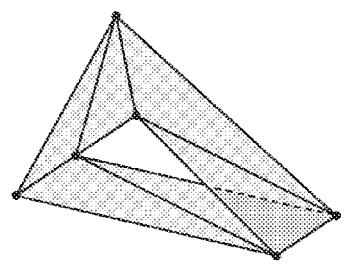
FIG. 64
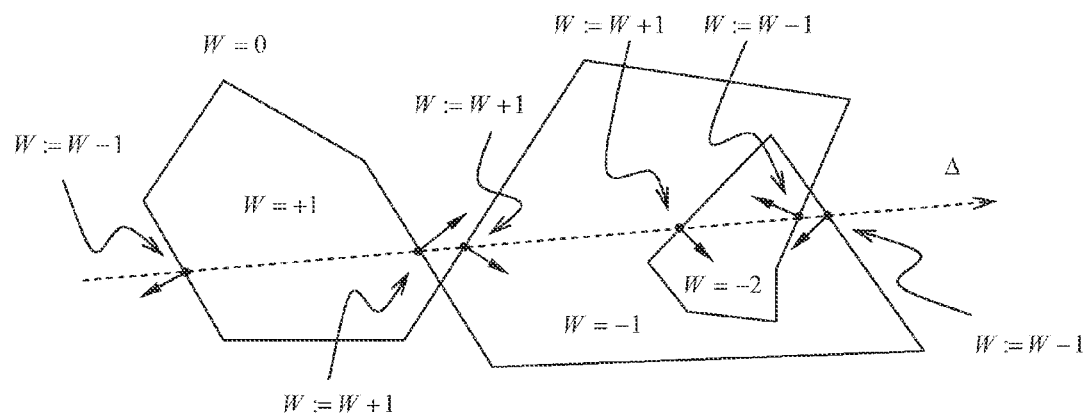
FIG. 65
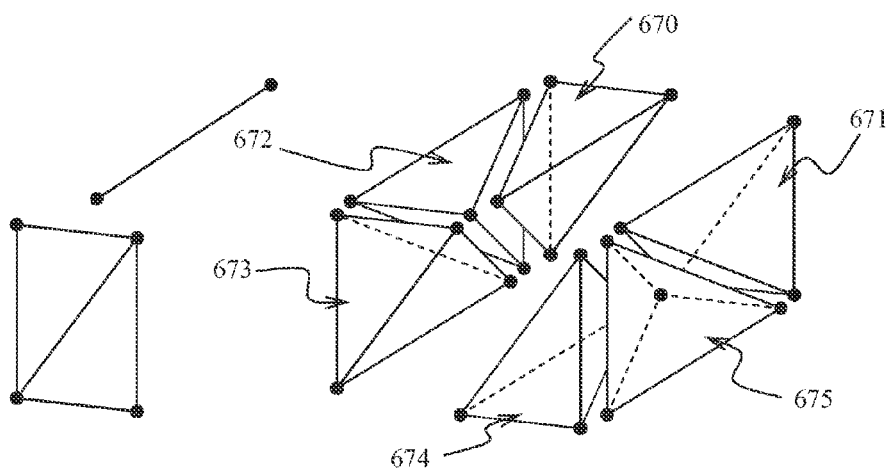
FIG. 66
FIG. 67

COMPUTER-IMPLEMENTED METHOD OF COMPUTING, IN A COMPUTER AIDED DESIGN SYSTEM, OF A BOUNDARY OF A MODELED OBJECT

RELATED APPLICATION(S)

This application claims priority under 35 U.S.C. §119 or 365 to European, Application No. 08291047.2, filed Nov. 7, 2008.

The entire teachings of the above application(s) are incorporated herein by reference.

TECHNICAL FIELD

The invention relates to the field of computers programs and systems, and more specifically to the field of computer-aided design (CAD), manufacturing (CAM), and engineering (CAE) systems.

BACKGROUND OF THE INVENTION

A number of systems and programs are offered on the market for the design of parts, assemblies of parts and products thereof, such as the one provided by Dassault Systèmes under the trademark CATIA (Computer Aided Three Dimensional Interactive Application). CATIA is a multi-platform CAD/CAM/CAE software suite, commonly referred to as a 3D Product Lifecycle Management (PLM) software suite. It supports multiple stages of product development (CAx), ranging from conceptualization, through design (CAD) and manufacturing (CAM), until analysis (CAE). This software suite is customizable via application programming interfaces (API). Some versions can be adapted in various programming languages, under dedicated APIs.

These so-called CAD systems notably allow a user to construct and manipulate complex three dimensional (3D) models of objects or assemblies of objects. CAD systems thus provide a representation of modeled objects using edges or lines, in certain cases with faces. These CAD systems manage parts or assemblies of parts as modeled objects, which are mainly specifications of geometry. In particular, CAD files contain specifications, from which geometry is generated. From geometry, a representation is generated. Specifications, geometry and representation may be stored in a single CAD file or multiple ones. CAD systems include graphic tools for representing the modeled objects to the designers; these tools are dedicated to the display of complex objects—the typical size of a file representing an object in a CAD system extending up to the range of a Mega-byte for part, and an assembly may comprise thousands of parts. A CAD system manages models of objects, which are stored in electronic files.

Designing a mechanical part with a known CAD system can be seen as defining the geometrical shape and dimensions of said part so as to fit functional and manufacturing requirements. Mainly, the resulting shape is a combination of basic features such as pad, pocket, groove, shaft etc. created by the designer. Through complex geometrical and topological computations, the CAD system yields the boundary representation of the solid (mechanical part) as e.g. a closed and oriented surface.

One knows the concept of swept volumes, e.g. in the fields of geometric design, machining simulation, robotics, or digital mockup. Given a solid, called "profile" in the following, and a trajectory thereof, we call the swept volume the union of all positions of the profile along the said trajectory. The representation of swept volumes can be used to design shapes, simulate the process of material removal or addition, detect collisions and compute clearance in moving parts and mechanisms. For instance the calculation of a swept volume is useful to determine the required space of a vehicle motor that is vibrating during its functioning. Also, the calculation of a swept volume is useful to determine the required space of a wheel of a vehicle while said wheel turns left and right and moves up and down thanks to shock absorbers. Also, the swept volume is useful to determine the required space of a manufacturing tool.

In this respect, one may rely on Minkowski sums or additions. An efficient computation of Minkowski sums may be used to compute large offsets and machining trajectories or repair polyhedral models.

Owing to the importance of swept volumes in geometric modeling, many solutions have been developed to represent the said swept volumes both in academic works and commercial applications.

A naive approach (hereafter referred to as method "M1") consists in considering the union of a finite number of instances of the profile volume along its trajectory.

A more elaborate method (hereafter "M2"), which has a number of variants, consists in decomposing a given solid or profile in convex parts, then producing the convex bodies resulting of the sweeping of each convex part by each segment of a piecewise linear trajectory, then take the union of all theses convex bodies (see e.g. "Accurate Minkowski sum approximation of polyhedral models", Gokul Varadhan, Dinesh Manocha, Graphical Models 68 (2006) 343-355, Video mode of MachineWorks uses this approach).

Another class of methods ("M3") consists in computing a superset of the boundary of the swept volume by considering all the pairs (profile triangle, trajectory point) or (profile edge, trajectory edge) that could, according to local geometry only, appear in the swept volume boundary. These methods produce a non structured set of triangles (a triangle "soup") whose union is, in theory, a subset of the swept volume and a superset of the swept volume boundary (see e.g. U.S. Pat. No. 6,993,461, in the name of Applicants).

A mathematically well founded method ("M4") known as "kinetic convolution" has been developed for two-dimensional (2D) swept body computation (see e.g. L. J. Guibas, M. Overmars, and J. Stolfi. A kinetic framework for computational geometry.

In proc. 24th Annu IEEE Sympos. Found. Comput. Sci, pages 100-11, 1983). This method produces a 2D closed piecewise linear curve. This pioneer work as since given rise to several 2D implementations such as described in:

Ron Wein, Exact and Efficient Construction of Planar Minkowski Sums using the Convolution Method ACS Technical Report No.: ACS-TR-241300-04; and Victor Milenkovic, Elisha Sacks: An approximate arrangement algorithm for semi-algebraic curves. Symposium on Computational Geometry 2006: 237-246.

On the other hand, other works extend the line of 2D work to 3D polyhedral solids. A main result is a procedure that, given two solids whose boundary is a polyhedral 2-manifold, computes a so called "polyhedral tracing", see e.g.:

J. Basch, L. J. Guibas, G. D. Ramkumar and L. Ramshaw, Polyhedral tracings and their convolution. In Proc. 2nd Workshop on Algorithmic Foundations of Robotics, 1996; and G. D. Ramkumar: "Tracings and their convolution: theory and applications", PhD. thesis (1998), Stanford, and related subsequent papers.

One knows two ways of implementing methods (M1), (M2), (M3) and (M4) in practice. For example methods (M1) and (M2) produce a set of solids whose union is the result.

Similarly, method (M3) produces a set of triangles. Computing in practice an explicit representation of the union at issue is not mandatory. It is even problematic for 3D complex geometries because it is extremely sensitive to rounding errors.

Another class of methods relies on voxel or dexel volume representations ("M5", cf. the "Photo mode" in "MachineWorks").

Next, the so-called "wrapping methods" ("M6") produce a watertight, rough approximation of the swept solid. It is fast and robust but it is not accurate. The technology is for instance described in "Swept volume approximation of a polygon soup", J. C. Himmelstein, E. Ferré, J. P. Laumond, International Conference on Robotics and Automation, 10-14 Apr. 2007, Roma, pp 4854-4860. It is implemented in "Kineo path planner" product of "Kineo Computer Aided Motion" company. This method amounts to compute an implicit representation of the swept volume by calculating the distance to the swept surface boundary on the vertices of a 3D regular grid. This distance field is computed from a sampling of the trajectory satisfying a given 3D tolerance on the resulting sweep. Then the outer skin is collected using a variant of a classical algorithm, known as the "marching cube".

Finally, a number of patents or patent applications broadly deals with the subject, see e.g. U.S. Pat. Nos. 7,091,995, 7,031,790, 6,690,385, 5,649,084, 6,307,555, 6,989,830, 6,988,121, EP-A-0 280 968, EP-A-0 405 106, EP-A-0 280 968, U.S. Pat. No. 5,159,512, US 2003/014133, US 2005/143963, and US 2004/059450.

The methods M1-M6 evoked above are not infallible.

For example, method (M1) requires considering a large number of instances of the swept volume and is therefore very expensive in memory and computation time if one asks for a good accuracy.

Method (M2) presents the same drawbacks as method (M1), yet in a lesser extent. For each segment of the trajectory and each convex part of the profile, it generates a body of roughly the same complexity (i.e. number of triangles) than the convex part.

Method (M3) is efficient in a number of respects. For example the number of produced triangles is of the order of magnitude of the number of triangles effectively produced in the result when the trajectory does not "wind" too much. A major drawback of this method is that it is sensitive with respect to rounding errors: an arbitrarily small perturbation in the vertices coordinates may create small gaps in the boundary of the result. Typically it is quite easy to produce the set of triangles. However, it is in general not possible to extract a topologically valid watertight polyhedron, due to robustness issues. Another limitation of (M3) is that it is restricted to one dimensional trajectory, which is not relevant to compute Minkowski sums.

An obvious drawback of the 2-dimensional version of method (M4) is that it is restricted to 2D polygons. In addition, the theoretical approach chosen here induces significant limitations. Firstly, it is intrinsically limited to Minkowski sum. In particular, path planning, robotics or machining applications of these procedures are restricted to translational motions (meaning that only 3 axis machining is possible). Secondly, the operands of the Minkowski sum have to be solids whose boundaries are polyhedral 2-manifolds with all their vertices satisfying the so called "hemisphere assumption": for each vertex V, the set of outward normal vectors to faces adjacent to V has to be included in a hemisphere. Now, there are numerous examples of a manifold vertex violating the hemisphere assumption. Finally, another drawback is that, as far as known by the present inventors, this 3D procedure has not been implemented basically.

Method (M5) is efficient and robust but the size of data increases dramatically with the desired accuracy. It is then a good method for applications where the accuracy is not critical.

Method (M6) produces a conservative approximation well suited to rough collision analysis but it is not accurate enough for machining simulations. Furthermore, the theoretical drawback is that the cost in time and memory increases as $O(1/\epsilon^3)$ where $\epsilon$ is the required accuracy, while a theoretical increase rate of $O(1/\epsilon)$ would be preferred. Indeed, in practice, method (M6) is fast if the relative accuracy (the ratio between the model size and the required accuracy) is small. The examples mentioned in the paper make use of grids whose sizes range from $32^3$ to $128^3$ voxels which leads respectively to the values 64 to 256 for the relative accuracy. This accuracy may be enough for rough path planning or collision detection or as a first fast rejection step. However manufacturing applications need relative accuracies which, typically, range from $10^3$ to $10^5$.

To summarize the above analysis, the prior art shows too much sensitivity with respect to rounding errors, is expensive either in memory or in computation cost, and/or is not accurate enough, at least for some applications. Accordingly, there remains a need for a robust (topologically correct and watertight) and accurate method of computing a swept volume (more generally a boundary of a modeled object), the method compatible with a large class of objects.

SUMMARY OF THE INVENTION

To this aim, and in one embodiment, the invention therefore provides a computer-implemented method of computing, in a computer aided design system, of a boundary of a modeled object, the method comprising: accessing data defining a modeled object as a simplicial m-complex; projecting the simplicial m-complex in $\Re^n$, $m \geq n$; computing a polyhedral boundary of said modeled object as a polyhedral n-1-cycle in the projection of the simplicial complex, the polyhedral n-1-cycle substantially bordering the projection of the simplicial complex.

In other embodiments, the method according to the invention may comprise one or more of the following features:

- at the step of computing, the polyhedral n–1-cycle comprises simplices of the projection of the simplicial complex;
- n=3 and the step of computing a polyhedral boundary comprises: testing triangles of the projection of the simplicial complex, wherein testing said triangles comprises, for each of the triangles tested, testing whether simplex cofaces of the triangle tested are on the same side of said each of the triangles tested;
- at the step of accessing data, said simplicial complex is a simplicial product.
- at the step of accessing data, said simplicial complex is a simplicial product of a polyhedral profile of a given object by a sequence of translations and/or transformations;
- at the step of accessing data, said simplicial complex is a simplicial product of a polyhedral profile of a given object by a simplicial complex in a space of translations and/or transformations;
- said simplicial product is representative of a space swept by said polyhedral profile along said simplicial complex in the space of translations and/or transformations;

said simplicial complex in a space of translations and/or transformations is a k-dimensional complex product of k sequences of translations and/or transformations;

said simplicial complex in the space of translations and/or transformations is a 3D polyhedron in the space of translations and/or transformations;

the simplicial product is representative of a space swept by said profile along said sequence;

before the step of accessing data, the method comprises a step of computing said simplicial product;

at the step of computing said simplicial product, the method further comprises: accessing data defining said polyhedral profile and said polyhedral trajectory; computing a Cartesian product from said polyhedral profile and said polyhedral trajectory; and carrying out a generalized triangulation of the computed Cartesian product.

The invention further proposes a computer program product comprising program code means adapted for implementing the method according to the invention.

The invention still concerns a computerized system comprising means for implementing the method according to the invention.

BRIEF DESCRIPTION OF THE DRAWINGS

A system embodying the invention will now be described, by way of non-limiting example, and in reference to the accompanying drawings shown in FIGS. 1-87, that will be discussed in the detailed description below.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIGS. 11-12 illustrate a sweep defining a modeled object as a simplicial m-complex.

FIGS. 13-14 are a schematic illustration of another (a second) case of sweep defining a modeled object as a simplicial m-complex.

FIGS. 15-17 are a schematic illustration of yet another (third) case of sweep defining a modeled object as a simplicial m-complex.

FIGS. 18-20 are a schematic illustration of a fourth case of sweep defining a modeled object as a simplicial m-complex.

FIGS. 21-25 are schematic illustrations of a 0-simplex, a 1-simplex, a 2-simplex and various 3-simplexes respectively.

FIG. 26 is a schematic view of the faces of the 3-simplex of FIG. 25.

FIGS. 33-34 illustrate Cartesian products and respective decomposition.

FIGS. 35-39 illustrate respective zero boundary condition verification.

FIGS. 62-64 are schematic views of various k-manifolds illustrating being orientable and not orientable.

FIG. 65 is a schematic illustration of a winding number computation in embodiments of the present invention.

FIGS. 66-67 are schematic views of two simplicial complexes and their simplicial product by trianglation.

DETAILED DESCRIPTION OF THE INVENTION

A description of example embodiments of the invention follows.

The teachings of all patents, published applications and references cited herein are incorporated by reference in their entirety.

The present invention provides a method of computing, in a CAD system, of a boundary of a modeled object, typically a swept volume. The modeled object is defined as a simplicial m-complex, typically obtained from a polyhedral profile and a polyhedral trajectory. The complex is then projected in $\Re^n$ (m≧n): to this aim, a suitable mapping or transformation can be invoked. Then, the method computes a polyhedral boundary of the modeled object as a polyhedral n−1-cycle of the projection of the simplicial complex, wherein the polyhedral n−1-cycle substantially borders the projection of the simplicial complex.

The invention is a general, efficient and robust method suited to compute quickly and accurately a boundary of modeled object, represented as a polyhedral cycle. For the sake of exemplification, we shall hereafter consider application to a swept volume. A definition of polyhedral cycles is given below. In particular, the output is not an unstructured set of triangles but, roughly speaking, a closed and topologically consistent polyhedral representation. Though this representation may intersect itself, it is combinatorial watertight. In particular, if a small perturbation or a floating point rounding is applied to the output, it remains valid (topologically correct and watertight), hence the robustness of the implemented algorithm. The invention makes it possible to safely compute a boundary of a modeled object even though the computed boundary may sometimes intersect itself. The invention has several applications that shall be described below. In addition, the robustness achieved thanks to the present scheme, i.e.

projecting the simplicial complex defining the object, and subsequently computing a polyhedral boundary as n−1-cycle, allows for saving substantial computation and memory load, compared to known methods.

For instance, compared to methods (M1) and (M5) discussed earlier, the method of the invention can achieve accuracy without requiring huge memory and computation time. Compared to (M2) the proposed method maintains a reasonable number of triangles. Compared to (M3) the proposed method produces a combinatorial watertight output which is stable with respect to rounding errors. Furthermore, it can in principle compute the sweep of a profile or arbitrary dimension along a trajectory of arbitrary dimension. In practice, this allows to compute Minkowski sum as well as the volume swept by a mechanism with an arbitrary number of degrees of freedom. The method (M4) is limited to 2D, which prevent application to the computation of 3D swept volumes, at variance with the present invention.

Figure 1:
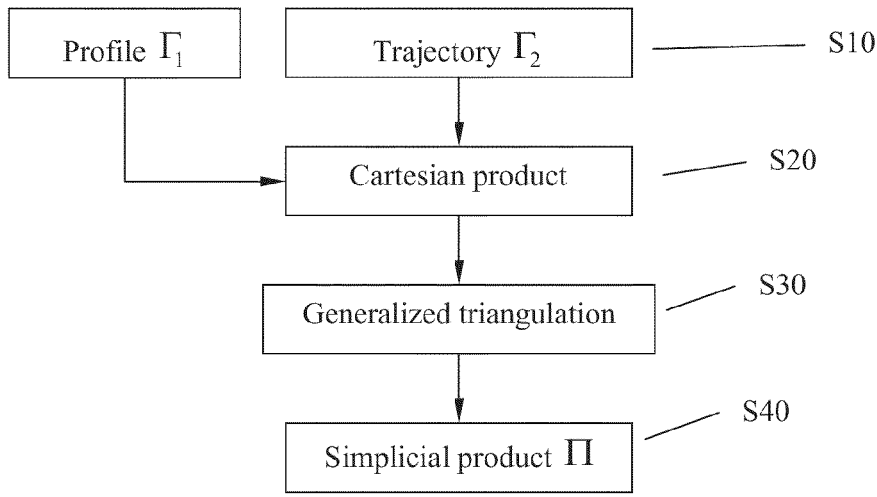
FIGS. 1 and 2 are data flow diagrams of an embodiment of the present invention.
Figure 2:
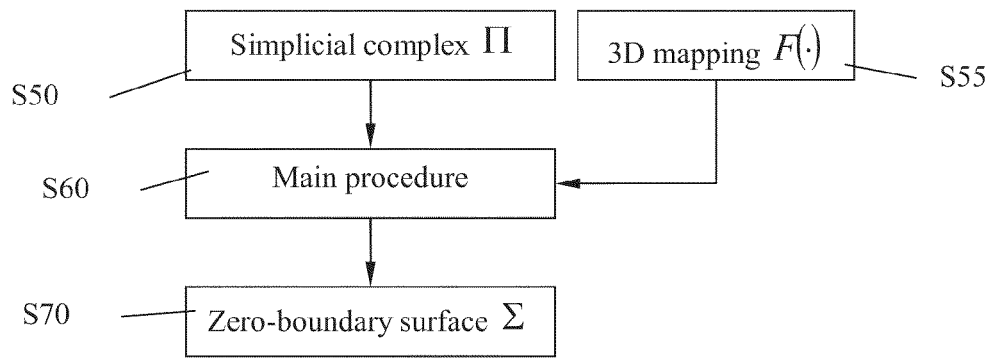

The overall process is now described in reference to FIGS. 1-2, describing a data flow according to an embodiment of the invention. FIG. 1 depicts exemplary steps for obtaining a simplicial product. FIG. 2 shows the steps leading from a simplicial complex to a zero-boundary surface.

First, as depicted in FIG. 2, the method comprises step S50 of accessing data defining a modeled object as a simplicial m-complex.

A simplicial complex is a topological space constructed by "gluing together" points, line segments, triangles, and more generally, their p-dimensional equivalents. One of the advantages of using simplicial complexes is that their properties can be generalized for any dimension m. Simplicial complexes make it possible to compute a boundary of a modeled object thanks to simple mathematic operations, what requires less resources than methods described in the prior art. Simplicial complexes are described in details below.

There are several ways of obtaining a simplicial m-complex. For example, a simplicial m-complex (also referred as simplicial complex) can be obtained as a simplicial product as depicted in FIG. 1. FIG. 1 gives an example for obtaining a simplicial complex in the way of a simplicial product. Steps S10-S40 show that a simplicial complex can be obtained from the product of a polyhedral profile $\Gamma_1$ times a polyhedral trajectory $\Gamma_2$. The product may be a simplicial product of a polyhedral profile of a given object by a sequence of translations and/or transformations, as shall be illustrated notably in reference to FIGS. 11-20 and to FIGS. 29-32.

The simplicial m-complex is a simplicial complex of dimension m. The integer m is the maximal dimension of all the simplices of the complex. m may be arbitrary large. For instance, if the dimension of the polyhedral profile $\Gamma_1$ is k with k=3 (for instance the polyhedral profile is a 3D shape) and the dimension of the polyhedral trajectory $\Gamma_2$ is l with l=2 (for instance the polyhedral trajectory is a 2D shape such as a triangle), then the dimension of the simplicial m-complex is a simplicial complex of dimension m=k+l, and in this example, m=3+2=5. If the dimension of the polyhedral profile $\Gamma_1$ is k with k=0 (for instance the polyhedral profile is a point) and the dimension of the polyhedral trajectory $\Gamma_2$ is l with l=0 (for instance the polyhedral trajectory is a point), then the dimension of the simplicial m-complex is a simplicial complex of dimension m=k+l, and in this example, m=0+0=0. Preferably, m≧2 if one wish to compute a 2D sweep, and m≧3 for a 3D sweep.

As depicted in FIG. 1, the simplicial product Π of $\Gamma_1$ and $\Gamma_2$ is itself preferably computed through a two steps process: a cartesian product at step S20 followed by a triangulation at step S30. In dimensions greater than 2, step S30 may comprise a tetrahedrisation. Thus, step S30 can be seen as a step of "generalized" triangulation.

The object Π blends the topologies of $\Gamma_1$ and $\Gamma_2$ into a higher dimensional structure that potentially includes both the topology and the geometry of the resulting swept surface. More generally and independently of the way the simplicial complex is obtained, a simplicial complex is, simply speaking, a suitable starting point for the step S60 of FIG. 2.

The step S60 of FIG. 2 calls a transformation or mapping function F(·), in order to project (or imbed) the simplicial m-complex in $\Re^n$, m≧n. The projection makes it possible to assign a location in an "ambient" space or "physical" space to each vertex of the simplicial m-complex, the "ambient" space being the space wherein the projection may be manipulated by the user of a CAD system. The integer n is the dimension of the "ambient space" or "physical space" in which the simplicial m-complex of step S50 is projected. The condition m≧n prevents cases in which the transformation or mapping function F(·) cannot occur. For instance, according to the previous example, the simplicial m-complex of dimension m=5 is projected via the transformation or mapping function F(·) into the "ambient" space with n=3, that is, the simplicial 5-complex is projected into a three-dimensional (3D) space. Also, as another example, it is possible that n=2 in order to compute planar shadows.

Yet, according to properties of simplicial complexes and the mapping function F(·), n is not restricted to a given range of values, and the minimum value of n is 1.

The simplicial m-complex of step 50 is somehow in "transitional" space inasmuch as the mapping function F(·) leads back the simplicial m-complex from an m-dimension space to an n-dimension space. For better understanding, the "simplicial m-complex" of the n-dimension space is called the "projection of the simplicial m-complex".

In an embodiment, a goal is to get the surface Σ (i.e., the swept surface) of profile $\Gamma_1$ along a trajectory $\Gamma_2$. There are several possibilities to project a simplicial m-complex in $\Re^n$, just as there are usually several manners of projecting an object onto another. Yet, a preferred embodiment that shall be discussed at length in the following provides the swept surface Σ through a simple and robust practical scheme, here called "multiplicity" procedure, which is performed on a projection of the simplicial complex Π.

On a global point of view, the steps of FIG. 2 provides a swept surface that is a zero-boundary surface E from an input simplicial complex Π and a mapping F(·) (for instance, a 3D mapping F(·)).

Despite the invention is likely to be applied to sweeping a triangulated closed surface along a trajectory, appended figures exemplify the overall process in 2-dimension space through a one dimensional plane profile swept along a plane trajectory; the plane profile and the plane trajectory being in the same plane. Such an exemplification is obviously easier to understand and to illustrate.

Figure 3:
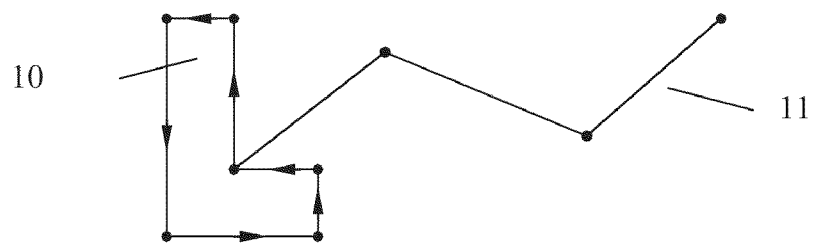
FIGS. 3-5 are schematic illustrations of a plane profile swept along a plane trajectory to provide a projection of a simplicial complex.

For instance, FIG. 3 shows a profile with closed contours, together with a trajectory represented by a polygonal line 11.

Figure 4:
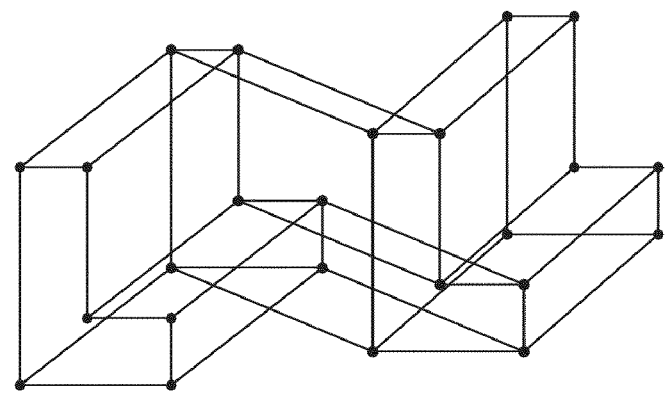

FIG. 4 illustrates a cartesian product of components of FIG. 3: parallelogram faces appear.

Figure 5:
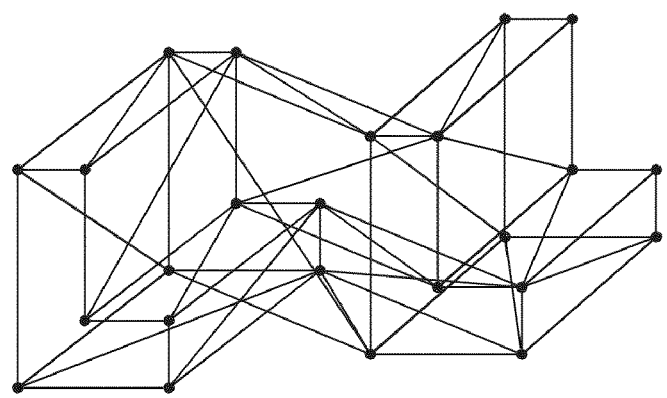

FIG. 5 shows a simplicial product thereof, whereby triangular faces come into view.

Figure 6:
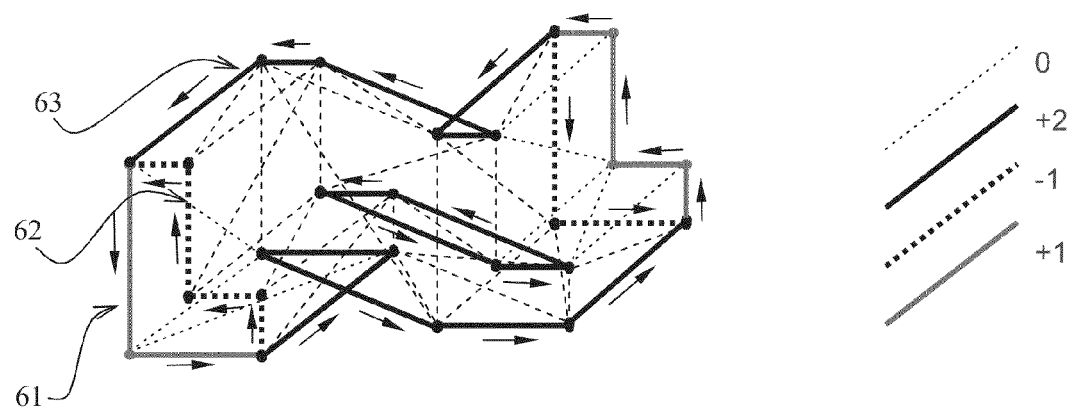
FIG. 6 is a schematic illustration of a multiplicity procedure of FIG. 2 as applied to the projection of the simiplicial complex of FIG. 5.

FIG. 6 shows the simple and robust practical scheme, called "multiplicity" procedure, which is performed at step S60 on a projection of the simplicial complex Π, which can be for instance a projection of the simplicial product. The output of the "multiplicity" procedure provides the zero-boundary surface Σ (which can be a polyhedral boundary) of step S70 shown at FIG. 7. In practice, steps of computing the polyhedral boundary amount to testing triangles of the projection of the simplicial complex. The "testing" at issue comprises, for each triangle tested, testing whether simplex cofaces of the triangle are on the same side of said triangle.

The multiplicity procedure computation aims at providing a boundary of the modeled object. To reach that goal, the multiplicity procedure uses an algorithm to compute a polyhedral n−1-cycle in the projection of the simplicial complex, which, as a result, substantially borders the projection of the simplicial complex. The integer n of the polyhedral n−1-cycle represents the dimension of the "ambient space" or "physical space" in which the simplicial m-complex provided at step S50 is projected. Preferably, the polyhedral n−1-cycle comprises simplices of the projection of the simplicial complex.

A polyhedral n−1-cycle is a particular polyhedral n−1-chain, which respects a condition called zero boundary condition. A polyhedral n−1-chain is a set of oriented n−1 simplices with a signed integer, called multiplicity, assigned to each n−1-simplex. Despite a polyhedral n−1-chain can be watertight, the watertight property is not mandatory. On the contrary, the polyhedral n−1-cycle meets the zero boundary condition, which confers the watertight property to polyhedral n−1-cycle. The zero boundary condition is explained below in the description.

During the multiplicity procedure, an orientation is provided to simplices of the projection of the simplicial complex (also referred as simplices for short). Incidentally, the orientation can also be provided to simplices of the simplicial complex, that is, prior to project the simplicial complex. The choice of the orientation provided to simplices of the projection of the simplicial complex (or simplices) is arbitrary and does not influence the final result. Indeed, if an opposite orientation is provided to a simplex of the projection of the simplicial complex (or simplex), the multiplicity procedure computation will lead to a multiplicity with an opposite sign. FIG. 6 depicts a choice of orientation shown by the various arrows.

Figure 40:
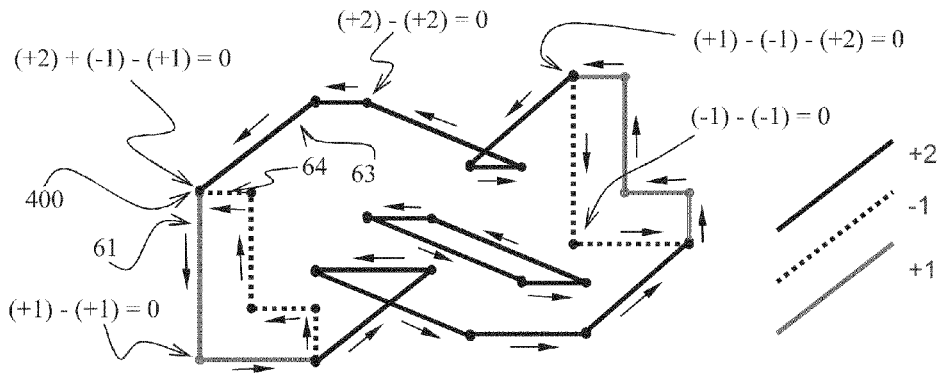
FIG. 40 further illustrates the multiplicity procedure of FIG. 6 using the sweep case of FIGS. 11-12.
Figure 71:
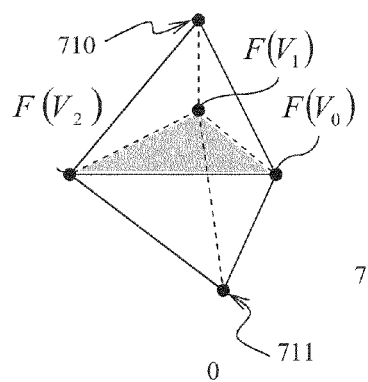
FIGS. 71-75 are schematic views illustrating the applications of the invention multiplicity procedure and then the main procedure on the triangles of FIGS. 68-70.
Figure 72:
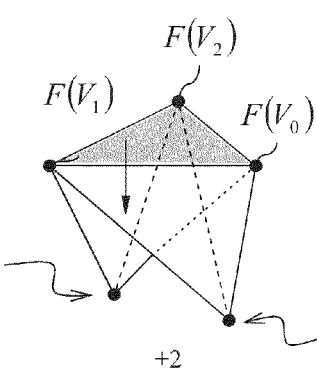
Figure 73:
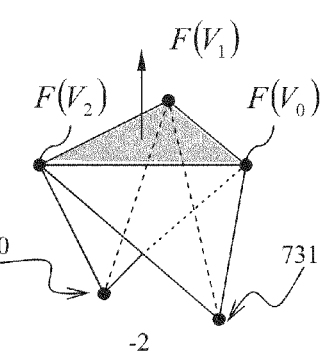

Then, the multiplicity of simplices of the projection of the simplicial complex is calculated. For instance, the multiplicity of an edge of the projection of the simplicial complex, which is a 1-simplex, is the number of multiple edges of the projection of the simplicial complex sharing the same end-vertices of the projection of the simplicial complex. FIGS. 6 and 40 illustrate the notion of edge multiplicity and FIGS. 71 to 73 show an example of how defining the multiplicity of a triangle.

Back to FIG. 6, the edge 63 has a multiplicity of +2 as it is shared by two triangles. The edges 61 and 62 have respectively a multiplicity of +1 and −1. Both edges are shared by one 1 triangle. However, as edges 61 and 62 have an opposite orientation, their multiplicity is opposed.

Then, the zero boundary condition is determined. In order to define the zero boundary condition, one consider the case where n=3. The resulting polyhedral 2-chain is defined by a set of logical vertices in 3D space and by a set of oriented triangles defined by ordered triples of vertices. Vertices are said logical vertices because two distinct logical vertices are allowed to share the same coordinates. Each oriented triangle is given a multiplicity such that changing the sign of the multiplicity is equivalent to reverse the triangle orientation. A polyhedral 2-chain is called a polyhedral 2-cycle if any edge, that is any pair of logical vertices appearing in a triangle, is traversed exactly the same number of times in the forward and reverse order by triangles counting multiplicities. This last condition is called the zero boundary condition.

Figure 7:
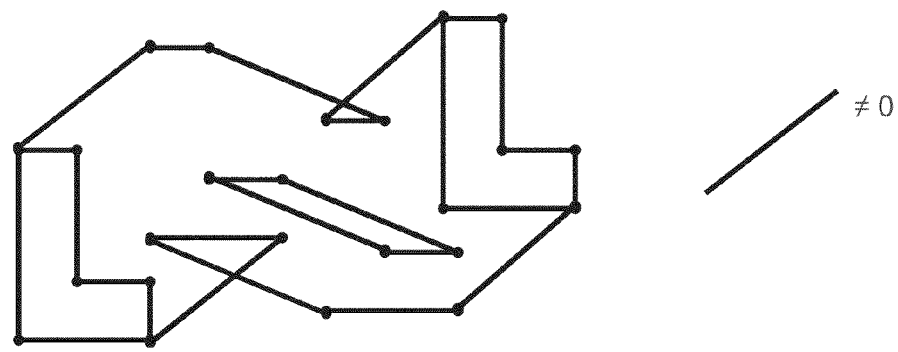
FIG. 7 is a schematic illustration of the output of the FIG. 6 multiplicity procedure.

FIG. 7 illustrates the non zero-multiplicity simplices (in this case, non zero-multiplicity segment or edge), which is the output of FIG. 2. On FIG. 6, the multiplicity procedure in S70 considers the one of two coface triangles of edge (or segments) 61, 62, 63, . . . in the projection of the simplicial complex Π and determines the situation of the third vertex of each segment with respect to the oriented segment. The multiplicity procedure applied on FIG. 6 will return +2 for segments in dark bold. The multiplicity procedure will return +1 for segments in clear bold. The multiplicity procedure will return −1 for bold dotted segments. The multiplicity procedure will return 0 for dotted segments. The fact that the multiplicity procedure returns 0 for dotted segments means that said segments have "material" on both sides, and thus said segments are not on the boundary of the projection of the simplicial complex. Where the multiplicity procedure returns +1, −1, +2 for other segments, this means that said segments have more or less "material" on one side, and thus said segments are on the boundary of the projection of the simplicial complex. The result appears on FIG. 7 where only segments with multiplicity different from 0 (also called edges or segments with non zero multiplicity) are kept. This leads to a boundary of the modeled object.

Figure 8:
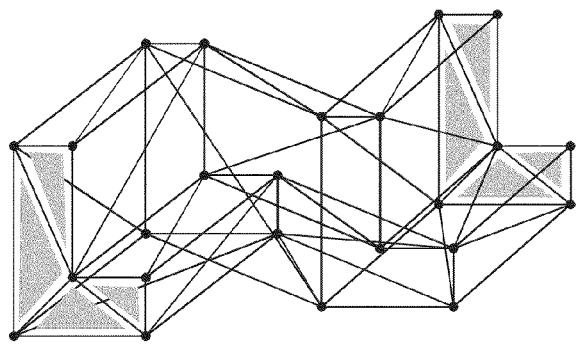
FIGS. 8-10 are schematic views depicting the steps of FIG. 2
Figure 9:
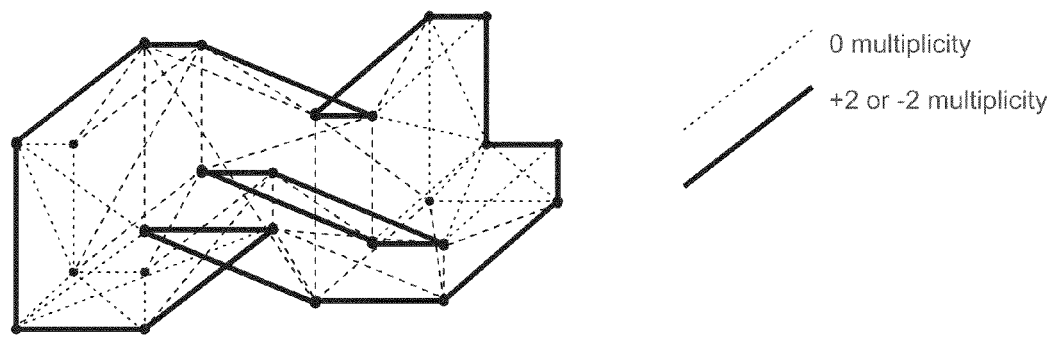
Figure 10:
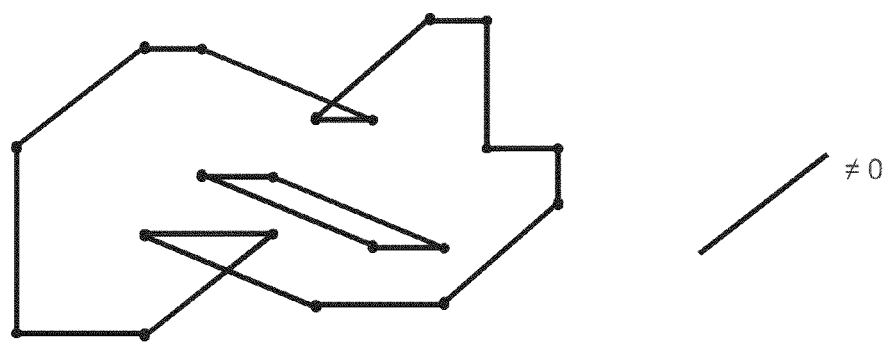

FIGS. 8, 9 and 10 depict the steps of FIG. 2. The simplicial complex Π is obtained by closing the "open tube" of the simplicial product of step S40 of FIG. 1 with two ending triangulated L-shape faces. The closure of the "open tube" is represented on FIG. 8 by shrinked and shaded triangles.

The simplicial complex of step S50 is thus the union of the L-face boundary times the trajectory, plus the L-face times the trajectory boundary which is represented by end points. This union is formally noted $\partial\Gamma_1 \times \Gamma_2 \,\Gamma \cup_1 \times \partial \Gamma_2$.

Once the simplicial m-complex is obtained from (for example) the simplicial product, the algorithm (the multiplicity procedure) of the main procedure of step S60 is run on the set of triangles. First, the m-simplicial complex is projected in $\Re^n$ (m≧n). Then the multiplicities of the projection of the simplicial complex are computed, as depicts by FIG. 9.

Then, the swept contour (the boundary) is gelded according to the non zero multiplicity, as shown on FIG. 10. Edges with a non-zero multiplicity are kept and provide the boundary of the projection of the simplicial complex.

The invention is a computer-implemented method of computing, in a computer aided design system, of a boundary of a modeled object. The method comprises the step of accessing data S50 defining a modeled object as a simplicial m-complex. FIGS. 11-20 illustrate four cases of sweep defining a modeled object as a simplicial m-complex. The four cases do not exhaust all possible sweeps.

Preferably, at the step of accessing data, the simplicial complex is a simplicial product S40, as illustrated in FIGS. 11-12. This is a simple situation of sweep. The profile $P_1$ is a polyhedron and a trajectory $P_2$ is a piecewise linear curve, in other words, a broken line. FIG. 12 represents the result of a sequence of translations of the profile $P_1$ over the trajectory $P_2$.

Advantageously, and still at the step of accessing data, the simplicial complex is a simplicial product S40 of a polyhedral profile of a given object by a sequence of translations and/or transformations. This covers a large number of ways to obtain a simplicial complex. FIGS. 13 and 14 illustrate such a transformation, which is a generalization of previous case. In this situation, the sequence of translation is replaced by a sequence of transformations operating on the polyhedral profile $P_1$. The sequence of transformation is still called the trajectory $P_2$. In this case the result is a linear approximation of consecutive transformations.

FIGS. 15, 16 and 17 show a further example. This case consists in the so called Minkowski sum of two polyhedrons: given two polyhedron $P_1$ and $P_2$ given by a triangulation of their boundary, the result is a representation of the Minkowski sum, denoted $P_1 \oplus P_2$, the set of points X in space which can be expressed as the sum of a point in $P_1$ and a point in $P_2$:

$$P_1 \oplus P_2 = \{x = x_1 + x_2, x_1 \in P_1, x_2 \in P_2\}$$

In other words $P_1 \oplus P_2$ can be seen as the union of all the copies of $P_1$ translated along vectors in $P_2$ or, equivalently, as the union of all the copies of $P_2$ translated along vectors in $P_1$. Polyhedron $P_1$ is the profile and polyhedron $P_2$ the trajectory but, in this particular case the profile and the trajectory play the same role and could be swapped.

FIGS. 18, 19 and 20 illustrate a further case, which is a generalization of the situation of FIGS. 16-17. $P_1$ is the profile and $P_2$ is the trajectory. In FIGS. 18, 19 and 20, the Polyhedron $P_2$ is an abstract polyhedron in a space of transformations. As shown on FIG. 19, the vertices of the trajectory $P_2$ are transformations that may be rotations, scalings or more general transformations of the space. The triangles are, as for usual triangulations, triples of vertices. FIG. 20 shows the result of the transformation. It can be seen as an approximation (by linear interpolation) of the union of all the images of points of $P_1$ by transformations in $P_2$.

The invention is a computer-implemented method of computing, in a computer aided design system, of a boundary of a modeled object. In other words, the invention is a computer-implemented method of design, in a computer aided design system, of a boundary of a modeled object. The method comprises the steps of accessing data S50, providing a mapping function $F(\cdot)$ at step S55, projecting the simplicial m-complex in $\mathfrak{R}^n$, m≧n, with the mapping function and computing a polyhedral boundary at steps S60-S70 of said modeled object.

Simplicial complexes, polyhedral chains and polyhedral cycles are presented with more details in order to give a general formulation of the steps S60-S70 of computing a polyhedral boundary of said modeled object as a polyhedral n−1-cycle in the projection of the simplicial complex, the polyhedral n−1-cycle substantially bordering the projection of the simplicial complex. Simplicial complexes generalize, in any dimension, the usual notion of triangulation. Simplicial complexes are topological space constructed by "gluing together" points, line segments, triangles, and more generally their p-dimensional equivalents.

For an integer k≧0, a k-simplex is the convex hull of k+1 points in a non degenerate position in an at least k-dimensional ambient space. These k+1 points are called the vertices of the simplex. We denote by $[v_0, v_1, \ldots, v_k]$ the k-simplex with vertices $v_0, v_1, \ldots, v_k$.

FIG. 21 exemplifies a 0-simplex $[v_0]$. The 0-simplex is a point, also called vertex. A 1-simplex $[v_0, v_1]$, illustrated in FIG. 22, is a segment between two distinct points, also referred as a general meaning as an edge between two vertices. FIG. 23 shows a 2-simplex $[v_0, v_1, v_2]$ that is a triangle spanned by three non collinear points. A 3-simplex $[v_0, v_1, v_2, v_3]$, depicted in FIG. 24, is a tetrahedron spanned by four non coplanar points. A 4-simplex $[v_0, v_1, v_2, v_3, v_4]$ is spanned by five points which do not fit in any 3-dimensional affine subspace in an at least 4-dimensional space . . . . The word simplex may also be used instead of the term k-simplex when the dimension k is not specified.

A face $\phi$ of a k-simplex $\sigma$ is any j-simplex, with j≦k whose vertices constitute a subset of the vertices of $\sigma$. FIG. 25 depicts a 3-simplex and FIG. 26 depict all faces of the 3-simplex.

A simplicial complex $\Gamma$ is a set of simplices such that:
if a simplex belongs to $\Gamma$ all its faces belong also to $\Gamma$,
the intersection of two simplices in $\Gamma$ is either empty, either a face of both.

The second condition means that a simplicial complex does not "self-intersect".

Figure 27:
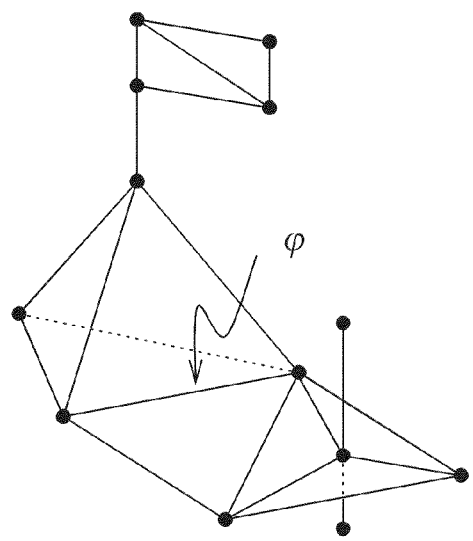
FIGS. 27 and 28 are schematic illustrations of cofaces.

A simplex $\sigma$ is said to be a coface of $\phi$ if $\phi$ is a face of $\sigma$, as depicted in FIGS. 27 (a simplicial complex) and 28 (all cofaces of edge $\phi$).

The dimension of a simplicial complex is the maximal dimension of its simplices.

In general both the profile and the trajectory are simplicial complexes. In cases of FIGS. 11-20 above, the profile is a triangle which is a 2-dimensional simplicial complex. In cases of FIGS. 11-14, the trajectory is a 1-dimensional simplicial complex. In cases of FIGS. 15-20, the trajectory is a 2-dimensional simplicial complex.

Given two simplicial complexes $\Gamma_1$ and $\Gamma_2$ it is possible to build a new simplicial complex, noted $\Pi$, for instance, the simplicial product of $\Gamma_1$ and $\Gamma_2$, as depicted in FIG. 1. This simplicial product is not unique as seen below. The set of vertices of $\Pi$ is the Cartesian product of the set of vertices of $\Gamma_1$ with the set of vertices of $\Gamma_2$. Therefore these new vertices belong to the Cartesian product of the respective ambient spaces of $\Gamma_1$ and $\Gamma_2$. Now given a couple of simplices $(\sigma_1, \sigma_2)$ where $\sigma_1$ is a simplex of $\Gamma_1$ and $\sigma_2$ a simplex of $\Gamma_2$, the Cartesian product of $\sigma_1$ by $\sigma_2$ is a convex polytope but is not a simplex if $\sigma_1$ or $\sigma_2$ is not a 0-simplex.

Figure 29:
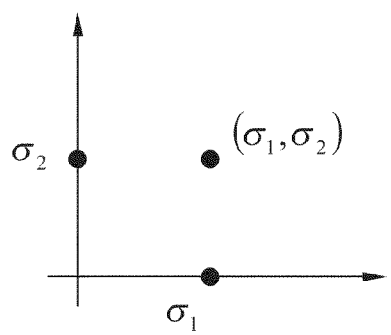
FIGS. 29 and 30 illustrate respective Cartesian products as computed at a step in FIG. 1.
Figure 30:
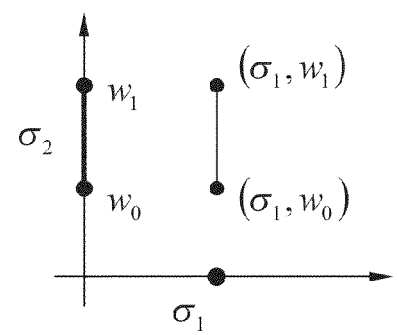

FIG. 29 shows a Cartesian product of two vertices as computed at step S20 of FIG. 1. FIG. 30 shows a Cartesian product of a vertex and an edge. Thus each of these Cartesian products have to be decomposed into simplices, that is triangulated, in order to get a simplicial complex, a genuine simplicial product. However, there is not a unique way of decomposing a Cartesian product into simplices which explains why the simplicial product is not unique.

Figure 31:
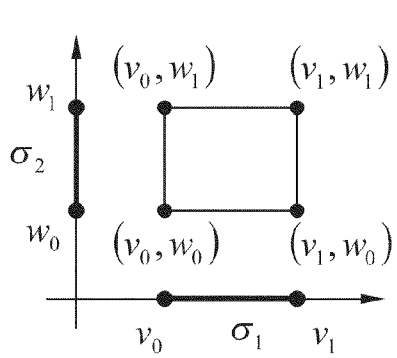
FIGS. 31-32 illustrate Cartesian products and respective decomposition.
Figure 32:
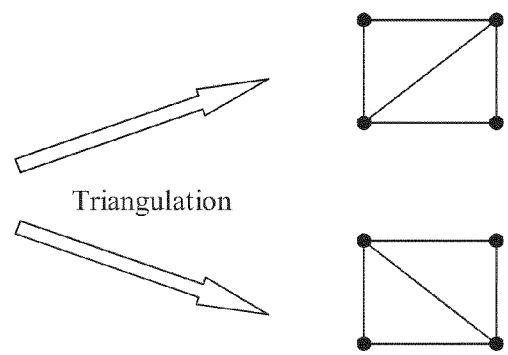

For example if $\sigma_1$ and $\sigma_2$ are 1-simplices (segments) as depicted in FIG. 31, their Cartesian product is a parallelogram in the product space and has to be decomposed into two triangles (2-simplices), as depicted in FIG. 32. As shown in FIG. 32, there are of course two ways of splitting a parallelogram into two triangles.

Similarly, as shown in FIGS. 33 and 34, if $\sigma_1$ is a 1-simplex (segment) and $\sigma_2$ a 2-simplex (triangle), their Cartesian product is a prism with a triangular basis which must be decomposed into three tetrahedrons (3-simplices), yielding the simplicial product. Again this decomposition is not unique. In general if $\sigma_1$ is a k-simplex and $\sigma_2$ a j-simplex, their Cartesian product can be decomposed into (k+J)-simplices.

The choice of this decomposition does not change the final result in cases of translational sweeps FIGS. 11-12 and FIGS. 15-17. Conversely, in FIGS. 13-14 and FIGS. 18-20, it is possible to choose the decomposition that minimizes some chordal error or the one that maximizes the output solid (for example for conservative collision detection).

Polyhedral n−1-Chain and Polyhedral n−1-Cycle

The FIG. 2 shows that the main procedure occurs once the simplicial m-complex is projected in $\mathfrak{R}^n$. The output of the algorithm of FIG. 2 is computed polyhedral n−1-cycle at steps S60-S70. For instance, once the simplicial m-complex is projected in $\mathfrak{R}^3$, a polyhedral 2-cycle is computed. Such a polyhedral 2-cycle is topologically watertight triangulation that may self-intersect but still defines inner and outer regions of the space.

More precisely, a polyhedral 2-chain is defined by a set of logical vertices in 3D space ($\mathfrak{R}^3$) and by a set of oriented triangles defined by ordered triples of vertices. Vertices are called logical vertices because two distinct logical vertices are allowed to share the same coordinates. Each oriented triangle is given a multiplicity such that changing the sign of the multiplicity is equivalent to reverse the triangle orientation. A polyhedral 2-chain is called a polyhedral 2-cycle if any edge, that is any pair of logical vertices appearing in a triangle, is traversed exactly the same number of times in the forward and reverse order by triangles counting multiplicities. This last condition will be called the zero boundary condition. In other words, a cycle is a chain satisfying the zero boundary condition.

FIG. 35 illustrates two polyhedral 1-cycles without self intersection. One can notice that the cycle on the left of the figure has two logical vertices 351, which share the same coordinates. In addition, both cycles are topologically watertight. Indeed the zero boundary condition is verified as each vertices is traversed exactly the same number of times in the forward and reverse order.

FIG. 36 exemplifies polyhedral 1-cycle self-intersecting. Again, the zero boundary condition is verified.

FIGS. 37-39 show an example of polyhedral 2-cycle. FIG. 37 illustrates a polyhedral 2-cycle which includes two tetrahedrons. Both tetrahedrons are connected via the segment (or edge) φ, which has four 2-cofaces (triangles) as illustrated in FIG. 38. Each of the four 2-cofaces is given a multiplicity such that changing the sign of the multiplicity is equivalent to reverse the triangle orientation (FIG. 39). One can notice that the zero boundary condition is verified in FIG. 39 since any pair of logical vertices appearing in a 2-cofaces is traversed exactly the same number of times in the forward and reverse order by triangles counting multiplicities.

FIG. 40 completes the FIG. 6. The figure illustrates the non zero-multiplicity segments (or edges) of the complex obtained by sweeping the L-shape closed contour along an open simple polygonal line, as shown in FIGS. 11-12.

By theorem, the non zero-multiplicity segments (or edges) define a cycle, which is a zero-boundary simplicial complex. The zero-boundary condition involves multiplicities and orientations in a very subtle manner. In FIG. 40, the zero-boundary condition means that at each vertex, the sum of the multiplicities of all incident edges is zero. Given a vertex v, by definition an "in" edge ends at v and an "out" edge starts at v. The multiplicity of a vertex is defined by the sum of all "in" edges multiplicities minus the sum of all "out" edges multiplicities".

For instance, the vertex 400 is the sum of the "in" edges 63 and 64 multiplicities minus the "out" edge 61 multiplicity. As a result, the vertex 400 has a multiplicity of (+2)+(−1)−(+1) =0. A similar operation is applied on each vertex, as shown on FIG. 40.

Among the advantages provided by polyhedral cycles, such cycles extend the notion of watertight manifold polyhedral solid boundary. Thus, the in/out regions of watertight polyhedrons are extended to the notion of index of a point with respect to a polyhedral cycle, an integer number counting in some sense "how many times a point is inside the current polyhedron".

In general, the perturbation of the coordinates of a usual watertight manifold polyhedral solid boundary can make it invalid. This is particularly the case when self-intersections occur. However, as the validity of a polyhedral cycle is purely combinatorial, it cannot be broken by coordinate perturbations. As a result, polyhedral cycle is stable, and this stability is a key ingredient of robustness.

For instance, applying a rotation matrix using floating point arithmetic to the vertices of a valid polyhedron can make it invalid because rounding errors occur. On the contrary, applying a rotation to the vertices of a polyhedral cycle is completely safe. Thus, robustness is granted.

Star and Link of Simplex

Figure 41:
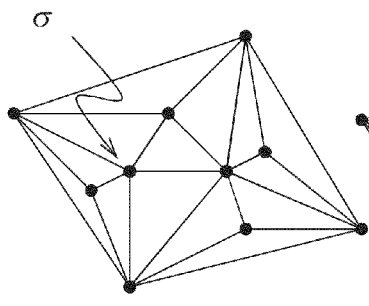
FIGS. 41-49 are schematic views illustrating definitions of a star and link of a complex.
Figure 42:
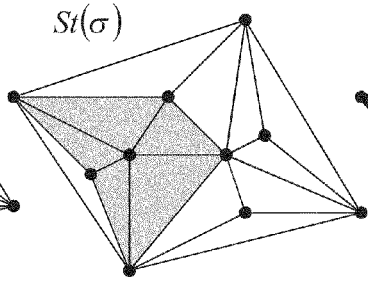
Figure 43:
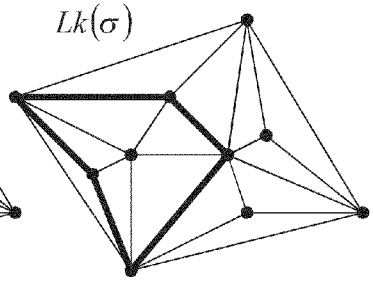
Figure 44:
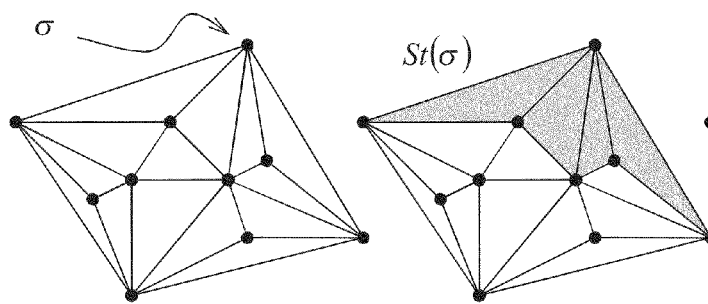
Figure 45:
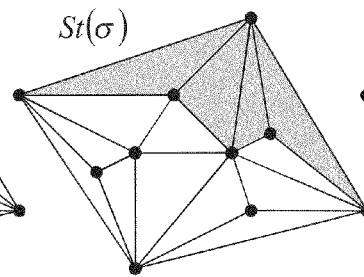

FIGS. 41 to 49 illustrate the definition of the star and link of a complex. The star of a simplex σ in a simplicial complex C (as shown in FIGS. 41 and 44) is the simplicial complex denoted St(σ, C) or St(σ) for short, that contains all the simplices of C containing σ, together with all their faces, as illustrated on FIGS. 42 and 45 (the shaded triangles).

Figure 28:
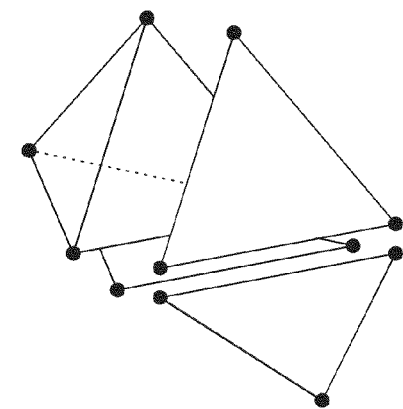

The simplicial complex St(σ) can be defined equivalently using the co-face concept that has been illustrated in FIGS. 27-28. Taking the co-faces of σ provides a set of simplices. Then, taking all the faces of all theses simplices yields the star of σ. Formally, St(σ)=Face(CoFace(σ)). The co-face of σ is a set of simplices but the star of σ is a simplicial complex, which is a structured object.

Figure 46:
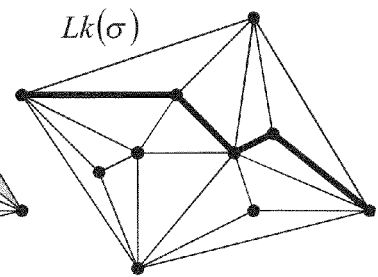

The link of a simplex 6 in a simplicial complex C is a simplicial complex denoted Lk(σ,C) or Lk(σ) for short, defined as the set of all simplicies in St(σ) that have an empty intersection with σ. In FIGS. 43 and 46, the link of vertex σ is a closed contour represented by a bold line. One can notice that the link of a boundary vertex can also be an open contour, as shown in FIG. 46.

Figure 47:
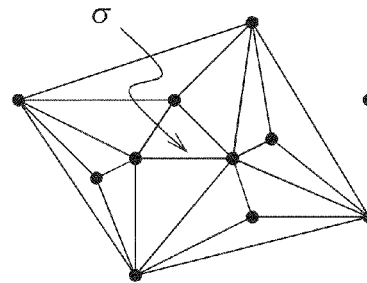
Figure 48:
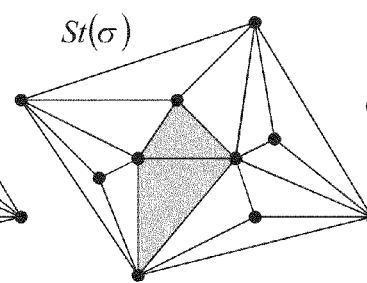
Figure 49:
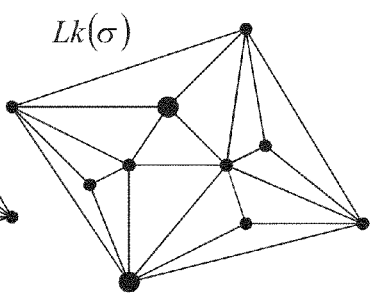

FIGS. 47 to 49 examplify the case where the simplex σ is an edge (or segment). In this case, the star of the simplex σ St(σ) is defined by two 2-simplicies (the shadowed triangles in FIG. 48), and the link of the simplex σ Lk(σ) is defined by two verticies (the large points in FIG. 49).

Combinatorial k-Manifold

FIGS. 50 to 61 illustrate the definition of a Combinatorial k-manifold. A simplicial complex C is a k-manifold if, for j=0, . . . , k, any j-simplex σ in C has a link Lk(σ) which is either homeomorphic to a k−j−1 dimensional disk or to a k−j−1 dimensional sphere. In other words, a simplicial complex C is a k−j−1 manifold whether it triangulates respectively a k−j−1 dimensional disk or a k−j−1 dimensional sphere. In the first case CT is said to be a boundary simplex and in the latter case it is said to be an interior simplex.

Figure 50:
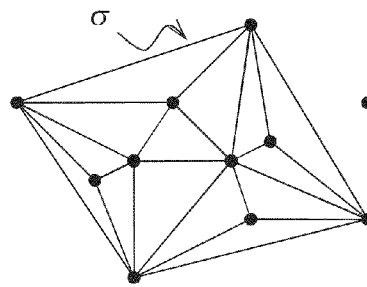
FIGS. 50-61 are schematic views illustrating definition of a combinatorial k-manifold simplicial complex.
Figure 51:
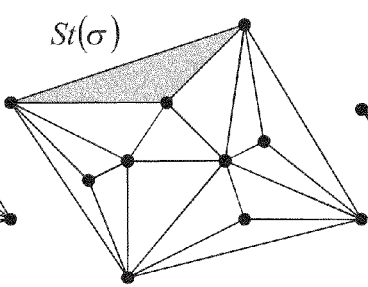
Figure 52:
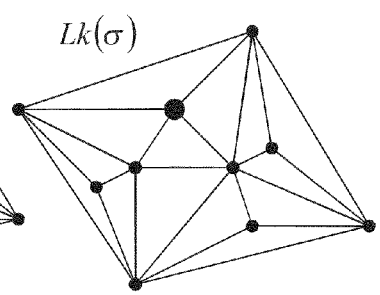

The simplicial complex in the previous FIGS. 47 to 49 is a 2-manifold according to the definition. All interior edges have a two-points link, and all boundary edges have a one-point link, as illustrated in FIGS. 50-52.

Figure 53:
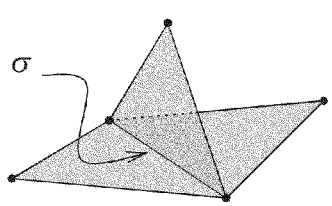
Figure 54:
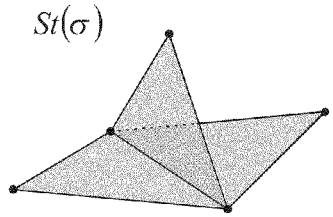
Figure 55:
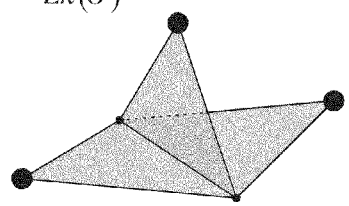

FIGS. 53-55 illustrate a simplicial complex that is not a 2-manifold. The edge σ is shared by three triangles. Its star includes the whole complex, and its link is made of three vertices, which is not a k−1−1=2−1−1=0 sphere or disk.

Figure 56:
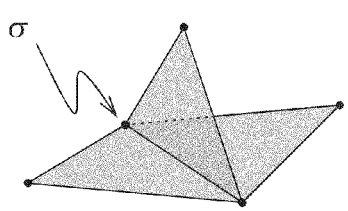
Figure 57:
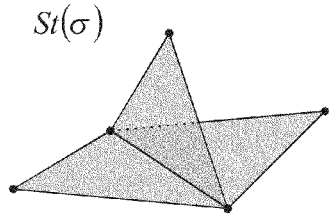
Figure 58:
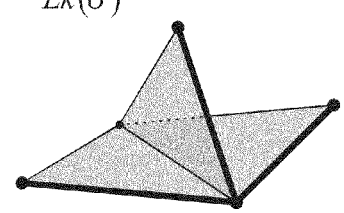

FIGS. 56-58 depict the star of a vertex σ that is the whole complex again, and its link is made of three lines sharing the opposite vertex. Clearly, this is not a k−0−1=2−0−1=1 sphere or disk.

FIGS. 56-58 illustrate that, in a k-manifold, interior k−1 simplices are faces of exactly two k-simplices. Translated in usual dimensional space, this is a generic way to say that an interior face of a tetrahedrized volume is shared by two tetrahedrons, an interior edge of a triangulated surface is shared by two triangles and the interior vertex of a simple polygonal line is shared by two edges.

Figures 59, 60, 61:
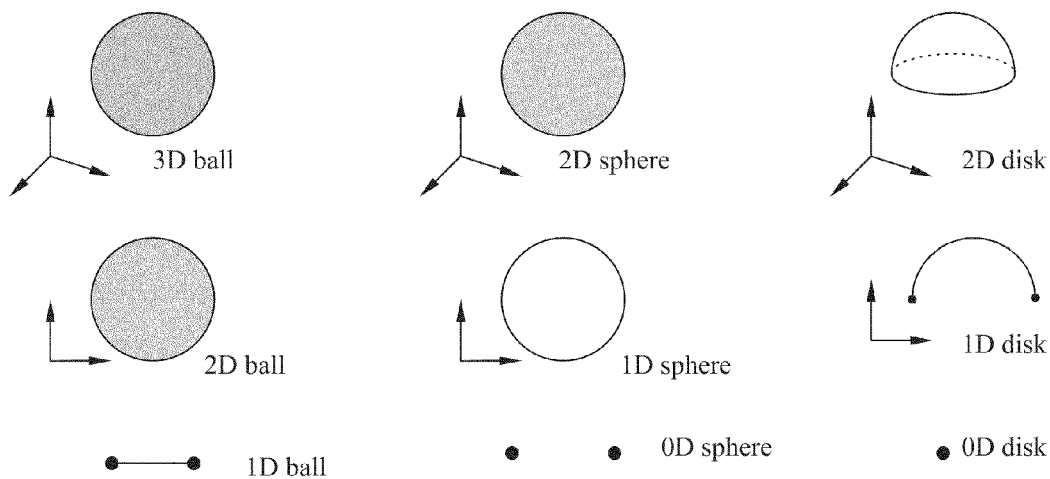

Ball, sphere and disk concepts are governed by the following logic, illustrated in FIGS. 59-61. Given an finite dimensional space, the unit ball is the set of points $X=(x_0, \ldots, x_n)$ such that $\|X\| \leq 1$. The unit sphere is the boundary of the unit ball, that is the set of points X such that $\|X\|=1$. The disk is the half part of the unit sphere, that is the set of points X such that $\|X\|=1$ and $x_0 \leq 0$.

FIGS. 59-61 illustrate usual dimensions. Topological equivalence between objects is defined as follows: an object that can be continuously deformed into the unit ball (respectively unit sphere, disk) without tearing is equivalent to the unit ball (respectively unit sphere, disk) and is named a ball (respectively sphere, disk) as well. Thus, from the topological point of view, a 2D disk is equivalent to a 2D ball and a 1D disk is equivalent to a 1D ball.

More generally, a k-dimensional disk is equivalent to a k-dimensional ball. One can notice that a 0-dimensional sphere is made of two isolated points (FIG. 60) and a 0-dimensional disk is an isolated point (FIG. 61), while, by convention, spheres and disks of negative dimensions are considered empty.

Orientable Combinatorial k-Manifold

Let $\sigma=[v_0, \ldots, v_k]$ be a k-simplex of a k-manifold C. Simplex $\sigma$ is oriented by the ordering of its vertices. The orientation of $\sigma$ induces the orientation of its (k−1)-simplices faces as follows. For all j=0, . . . , k, the ordering $[v_0, \ldots, v_{j-1}, v_{j+1}, \ldots, v_k]$ (that is omitting the $j^{th}$ vertex) defines the orientation induced on this (k−1)-simplex if j is even and the inverse of its orientation if j is odd. Reversing a simplex orientation means that one should swap, for example, the two first vertices.

Figure 62:
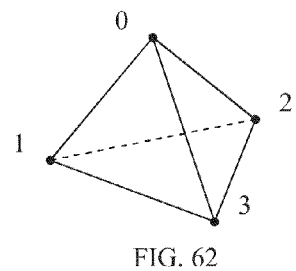

For example, orienting the tetrahedron in FIG. 62 by $\sigma=[0,1,2,3]$ induces the following triangles orientations: [1,2,3], −[0,2,3]=[2,0,3], [0,1,3] and −[0,1,2]=[1,0,2]. Conversely, if the tetrahedron orientation is reversed, that is $\sigma=[1,0,2,3]$, this induces reverse orientations of the triangles.

A combinatorial k-manifold C is said to be orientable if it is possible to assign a "consistent" orientation to each k-simplex $\sigma$ in C by specifying an ordering of the vertices of $\sigma$. Consistency of orientation means the following. The definition of combinatorial k-manifolds entails that any interior k−1-simplex $\phi$ of C is a face of exactly two k-simplices, noted $\sigma_1(\phi)$ and $\sigma_2(\phi)$. The given orientation is said to be "consistent" if the orientations induced on $\phi$ by $\sigma_1(\phi)$ and $\sigma_2(\phi)$ are opposite. In other words, it is consistent if the two induced orderings are related through an odd permutation (i.e. of negative signature).

Figure 63:
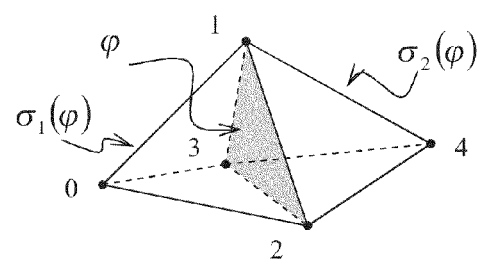

In FIG. 63, the 3-manifold C is made of two tetrahedron $\sigma_1(\phi)$ and $\sigma_2(\phi)$ sharing triangle $\phi$. Orienting $\sigma_1(\phi)=[0,1,2,3]$ induces [1,2,3] as $\phi$ orientation. Orienting $\sigma_2(\phi)=[2,1,3,4]$ induces −[2,1,3]=[1,2,3] as $\phi$ orientation. Clearly, complex C is not oriented. Nevertheless, it is orientable by reversing either $\sigma_1(\phi)$ orientation or $\sigma_2(\phi)$ orientation.

Not all k-manifolds are orientable. The 2-manifold of FIG. 64 is a triangulation of the Moebius strip, it is not orientable.

3D Cell, 3D Outer Cell

It is defined first the "support" of a "polyhedral cycle" $\Gamma$ to be the union of all its triangles. The connected components of the complement of the support of $\Gamma$ in 3-space are called 3D cells. Only one 3D cell is not bounded and is called the "outer cell".

Winding Number

Given a polyhedral cycle $\Gamma$, recall that each triangle of $\Gamma$ is oriented by the ordering of its three vertices and this ordering defines a normal vector. Furthermore, each triangle of $\Gamma$ has an integer multiplicity. Given a point X in 3-space which does not belong to any triangle from $\Gamma$, the winding number of X with respect to $\Gamma$ is an integer number W defined as follows. Consider an oriented half line $\Delta$ starting at X and intersecting no edge from $\Gamma$. Such a $\Delta$ always exists. Call $\delta$ the unit vector defining the direction of $\Delta$ pointing from X toward infinity. When $\Delta$ intersects a triangle T from $\Gamma$, we say that $\Delta$ crosses T forward if the dot product of $\delta$ with the normal $n_T$ of T is positive and backward if it is negative. It cannot be zero, as this would imply that $\Delta$ intersects at least one edge from $\Gamma$.

Initialize the integer W with the value W=0. Each time $\Delta$ crosses a triangle T from $\Gamma$ with multiplicity $\mu_T$, increment W of $\mu_T$ if $\Delta$ crosses T forward and decrement W of $\mu_T$ if $\Delta$ crosses T backward.

$$W:=W+\text{sign}(n_T\cdot\delta)\mu_T.$$

The resulting number W(X,$\Gamma$) is called the winding number of X with respect to $\Gamma$. It does not depend on half-line $\Delta$ and it is constant in any 3D cell, meaning that W(X,$\Gamma$) has the same value for all points X within the same 3D cell. In particular, W(X,$\Gamma$)=0 for all points X within the outer cell.

FIG. 65 illustrates the winding number computation with a (self intersecting) planar contour. Line segments orientations define normal vectors. The dotted line $\Delta$ is oriented from left to right. Given a point X on line $\Delta$, the computation of its winding number W is to initialize W:=0 and to move from X toward infinity (toward the right side of the figure) along line $\Delta$. During this motion, increment W:=W+1 or decrement W:=W−1 (as illustrated in the figure) when crossing the contour.

Procedure

Given the two simplicial complexes $\Gamma_1$ (the profile) and $\Gamma_2$ (the trajectory), the procedure may first builds their simplicial product $\Pi$ as depicted in FIG. 1. Starting form a simplicial complex $\Pi$, each vertex V=$(v_1,v_2)$ of $\Pi$ can be mapped naturally to a point F(V) in 3D-space as depicted in FIG. 2. For example, in cases of FIGS. 11-12 and FIGS. 15-17 this point is the sum F(V)=$v_1+v_2$ while in cases of FIGS. 13-14 and FIGS. 18-20 this point is F(V)=$v_2(v_1)$ the image of $v_1$ by the transformation $v_2$.

As an example, if $\tau=[V_0,V_1,V_2]$ is a 2-simplex (triangle) in the simplicial product $\Pi$, we consider the (possibly degenerated) triangle $(F(V_0),F(V_1),F(V_2))$ oriented by the order of the triple. This oriented triangle defines a normal vector.

$$N=(F(V_1)-F(V_0))\times(F(V_2)-F(V_0))$$

Notice that N can be zero if $F(V_0)$, $F(V_1)$ and $F(V_2)$ are collinear. Given a triangle $\tau=[V_0,V_1,V_2]$, the multiplicity procedure computes a signed integer number called the multiplicity of $\tau$.

The multiplicity pseudo-code, in the case of n=3, may read in the following way:

```
Input: τ =[V0,V1,V2]
Output: multiplicity (τ)
N=(F(V1)−(F(V0))×(F(V2)−(F(V0))
int Mult = 0 ;
For( all σ coface of τ )
    bool σ+ = FALSE
    bool σ− = FALSE
    For( all Vi vertices of σ )
        if((F(Vi)−F(V0))·N>0) σ+ = TRUE
        if((F(Vi)−F(V0))·N<0) σ− = TRUE
    EndFor
    if (σ+) Mult = Mult + (−1)dim(σ)−3
    if (σ−) Mult = Mult − (−1)dim(σ)−3
EndFor
Return Mult
```

Notice that the dim($\sigma$)−3 exponent involved in the Mult variable computation is related to the dimension of the 3D ambient space. In a 2D ambient space the multiplicity of a segment is computed by a similar procedure using a dim($\sigma$)−2 exponent. More generally, for a dimension n "ambient" space, the exponent is dim($\sigma$)−n.

A non-optimized main procedure pseudo-code, in the case of n=3, may read as following:

```
Input: a Profile C_1 (or P1), a Trajectory C_2 (or P2)
Output: a polyhedral 2-cycle Σ
Π = simplicial complex product of C_1 and C_2
Σ = empty polyhedral 2-chain
For ( all [V_0,V_1,V_2] 2-simplex of Π )
    int Mult = MULTIPLICITY([V_0,V_1,V_2])
    If Mult!= 0
        Add [F(V_0),F(V_1),F(V_2)] to Σ with the multiplicity Mult;
        EndIf
    EndFor
Return Σ
```

In order to make the above procedure more intuitive and practical we examine now how it specializes in case of FIGS. 11-12. In this case, the simplicial complex $\Gamma_1$ is the profile P1, a triangulation of a L shaped polygon. It is a 2-dimensional simplicial complex. Simplicial complex $\Gamma_2$ is the trajectory P2, a broken line linearly interpolating the successive positions. It is a 1-dimensional simplicial complex. Cartesian products of triangles of $\Gamma_1$ with edges of $\Gamma_2$ are prisms, while Cartesian products of edges of $\Gamma_1$ with edges of $\Gamma_2$ are parallelograms. The procedure triangulates these products, each prism gives rise to three tetrahedrons while each parallelogram gives rise to two triangles, thus yielding the simplicial product. FIG. 66 depicts two simplicial complexes whereas FIG. 67 depicts a triangulation of their Cartesian product (tetrahedrons 670, 671, 672, 673, 674, 675).

The triangulation procedure described below makes this triangulation consistent which means that the boundary triangles of the tetrahedrons produced by the decomposition of prisms have to coincide with the boundary triangles produced by the decomposition of parallelograms.

Figure 68:
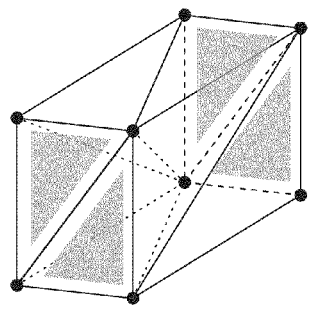
FIGS. 68-70 are schematic views of three kinds of triangles of the simplicial product of FIGS. 66-67.
Figure 69:
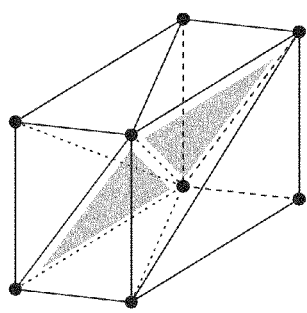
Figure 70:
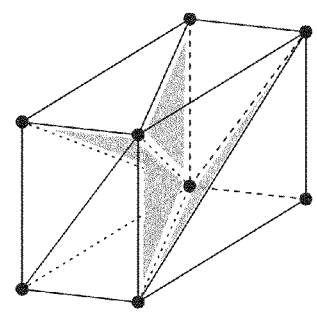

Once the simplicial product Π is computed (for instance through the Cartesian product triangulation), the procedures of S70 above can be applied. The multiplicity procedure takes a triangle of the simplicial product Π as input. In case FIGS. 11-12 there are three kinds of triangles in this product: triangles of type 1 (FIG. 68) coming from the product of a triangle of $\Gamma_1$ with a vertex of $\Gamma_2$, triangles of type 2 (FIG. 69) coming from the decomposition into two triangles of a parallelogram, product of an edge of $\Gamma_1$ with an edge of $\Gamma_2$ and triangle of type 3 (FIG. 70) coming from the decomposition of a prism, product of a triangle of $\Gamma_1$ with an edge of $\Gamma_2$. In the first case each such triangle is a face of exactly one tetrahedron if the vertex is the first or last in the trajectory and of exactly two tetrahedrons for other vertices. In the second and third cases (assuming that the triangulation $\Gamma_1$ of the profile is a manifold without boundary) each triangle is the face of exactly two tetrahedrons.

Each triangle of the product has a 3D image given by the images of its vertices by F. In this particular case, each vertex of the triangle is a couple $(v_1,v_2)$ where $v_1$ is a vertex of the profile $\Gamma_1$ and $v_2$ is a vertex of the trajectory $\Gamma_2$ and its image by F is just $F(v_1,v_2)=v_1+v_2$.

If the image of the triangle in 3D space is not collinear, it defines an oriented plane which is the plane supporting the image triangle and oriented by the triangle orientation. For this given triangle (see FIGS. 71 to 73), the multiplicity procedure in S70 considers the one or two coface tetrahedrons of the triangle in product Π and determines the situation of the fourth vertex of each tetrahedron with respect to the oriented plane.

On FIG. 73, when the fourth vertex 730, 731 of each tetrahedron is on the negative side, the multiplicity procedure will return −2 since the factor $(-1)^{dim(O)-3}=1$. On FIG. 72, when the fourth vertex 720, 721 of each tetrahedron is on the negative side, the multiplicity procedure will return +2. On FIG. 71, when the fourth vertex 710 of one tetrahedron is on the positive side and the fourth vertex 711 of the other tetrahedron is on the negative side, the multiplicity procedure will return 0.

The main procedure scans all triangles of product Π and inserts the corresponding triangles with the corresponding multiplicity in the resulting chain Σ.

In fact, most triangles have zero multiplicity. In order to accelerate the main procedure, it is possible to filter out most of the triangles in the simplicial product (or more generally the simplicial complex) using the outer normal information. Let us describe one possible way to optimize the procedure in the case of FIGS. 11-12.

Figure 74:
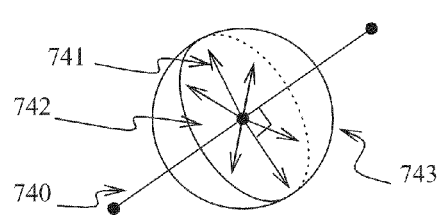
Figure 75:
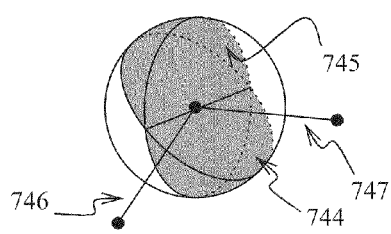

Notice that, given a segment 740 of the trajectory the set of perpendicular unit vectors 741 to this segment 740 is a great circle 742 on the unit sphere 743 (see FIG. 74). The circles 744, 745 of two consecutive segments 746, 747 define a sector on the unit sphere (see FIG. 75).

Figure 76:
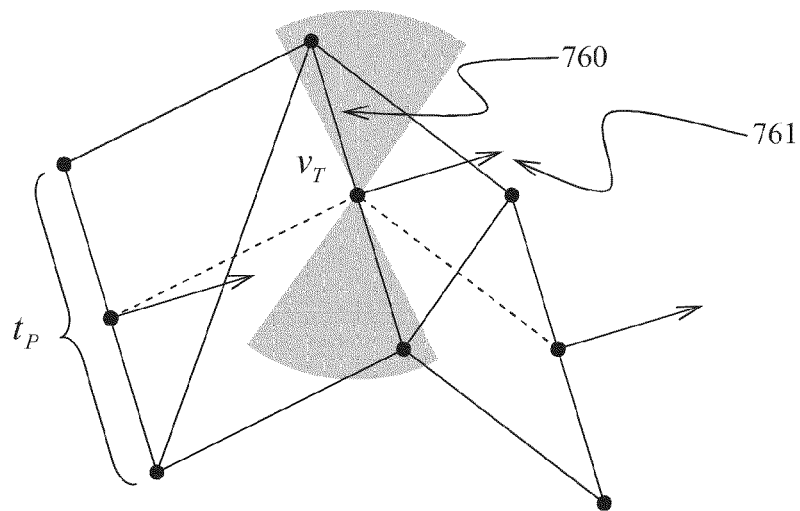
FIGS. 76-80 are schematic views illustrating an optimization of the procedure of FIGS. 71-75.

In FIG. 76, the triangles product of a triangle $t_p$ of the profile by a vertex $v_T$ of the trajectory will be attributed a zero index by the multiplicity procedure if the normal to $t_p$ does not point into the sector delimited by the great circles normal to the two trajectory segments adjacent to $v_T$. On FIG. 76, reference 760 indicates a zero-multiplicity and reference 761 indicates a normal vector that is outside the sector.

Figure 77:
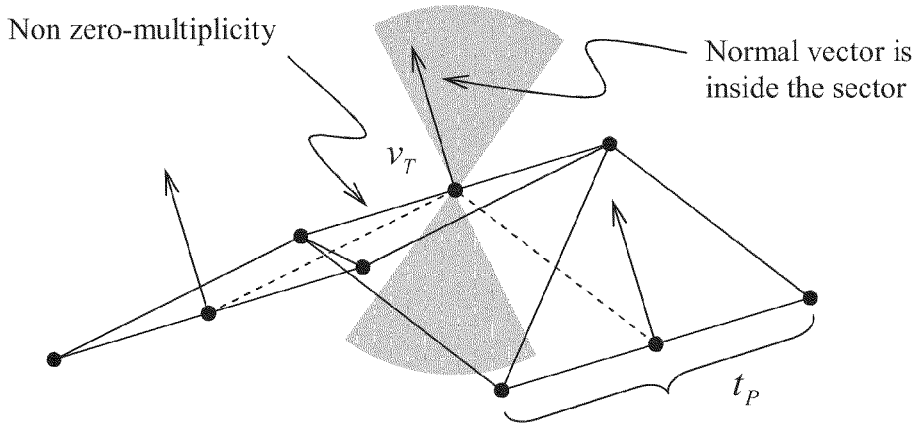

In FIG. 76 and in FIG. 77, the plane of triangle $t_p$ is perpendicular to the plane of the figure: this is why triangle $t_p$ is drawn as a line segment and why its unit normal vector is included in the plane of the figure. Furthermore, the trajectory (dotted line) is included in the plane of the figure.

Figure 78:
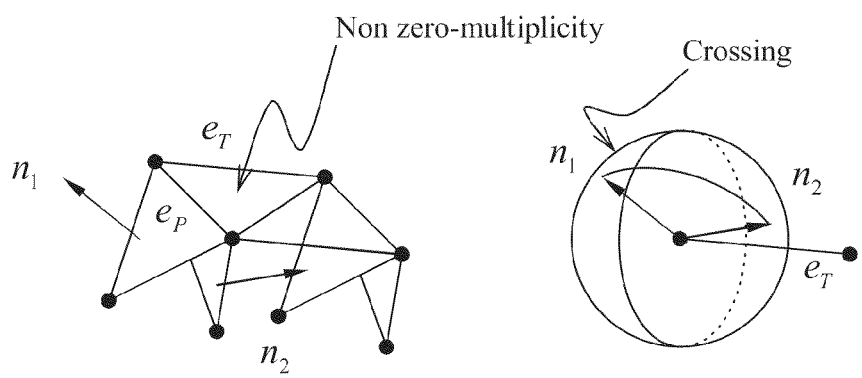
Figure 79:
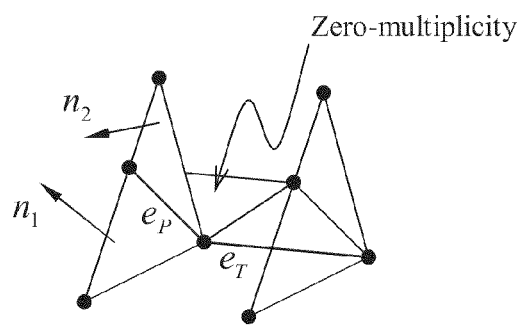
Figure 80:
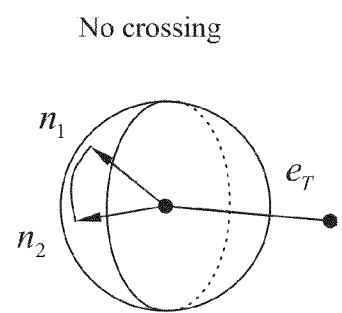

Similarly, as shown in FIGS. 78-80 a triangle part of the parallelogram product of an edge $e_P$ of the profile by an edge $e_T$ of the trajectory will be attributed a zero index by the multiplicity procedure if the arc of great circle joining the normal to the triangles of the profile adjacent to edge $e_P$ does not cut the great circle normal to edge $e_T$.

Using a localization structure (quad-tree for example) on the unit sphere one can attach to each cell of the unit sphere the set of triangles whose outer unit normal points inside this cell. Then, for respectively each segment and each vertex of the trajectory, the remarks above allow recovering respectively the set of trajectory segments and the set of profile triangles the product of which will produce a non zero multiplicity triangle. This recovering is performed by scanning the localization data structure.

How the Output Polyhedral Cycle Represents the Swept Volume

In many situations, the output polyhedral cycle provides a representation of the swept volume. In order to make this more precise, three general situations (situations 1, 2, 3) are described for which one can actually make use of the output cycle. Note that the general procedure is symmetric in the two operands (profile and trajectory) and therefore, in the situations below, one can swap the operands $C_1$ and $C_2$.

Situation 1 occurs when the two following properties hold:
Operand $C_1$ is a 1-dimensional simplicial complex without cycle. In graph theory, such a structure is called a forest (or a tree when it is connected).
The map $F:C_1 \times C_2 \to R^3$ is injective with respect to the second argument, in other words, for any a in $C_1$:

if $F(a,b_1)=F(a,b_2)$ then $b_1=b_2$.

In this case, the output cycle Γ contains the boundary of the swept volume (or more generally, the boundary of the modeled object) and may be some extra surfaces in the interior of the swept volume. A graphic rendering of the cycle always provides a visually correct representation of the swept volume when computed from a view point that is outside the swept volume. Moreover, the winding number of the cycle provides a membership predicate to the swept volume: a point space which does not belong to any triangle from Γ is in the interior of the swept volume if and only if its winding number with respect to Γ is positive. The present method provides a good graphic rendering even if extra surfaces are present. There is no need in the present method to re-calculate the boundary in order to delete the extra surfaces in the interior of the boundary. This reduces the amount of calcul and preserves the resources.

Situation 2 occurs when the two following properties hold:
Operand q is an oriented combinatorial 3-manifold.
For any point b in operand $C_2$, the map $F(\cdot,b)$ gives a positive orientation to the tetrahedrons of $C_1$. That is for any oriented 3-simplex $[V_0,V_1,V_2,V_3]$ in $C_1$, the determinant of the three vectors $F(V_1,b)-F(V_0,b)$, $F(V_2,b)-F(V_0,b)$, and $F(V_3,b)-F(V_0,b)$ is strictly positive, $$\det(F(V_1,b)-F(V_0,b),F(V_2,b)-F(V_0,b),F(V_3,b)-F(V_0,b))>0$$

Situation 3 occurs when $C_1$ is a combinatorial $k_1$-manifold and $C_2$ a combinatorial $k_2$-manifold where $k_1$ is odd and $k_2$ is even. In situations 2 or 3, as in situation 1, the output cycle contains the boundary of the swept volume (or more generally, the boundary of the modeled object) and may be some extra surfaces in the interior of the swept volume. A graphic rendering of the cycle always provides a visually correct representation of the swept volume when computed from a view point that is outside the swept volume. Moreover, the cycle determines without ambiguity the outer skin of the swept volume. More precisely, the boundary of outer 3D cell induced by the output cycle is the outer skin of the swept volume. The same remarks as formulated for situation 1 apply here.

An example of situation 1 is when the trajectory is a 1-dimensional piecewise linear curve in the set of invertible affine transformations (for example with its vertices being isometries) and parameterized by the time: in this case it is indeed cycle free.

A more elaborated example is the following. In order to compute the Minkowski sum of the skin of two polyhedrons, it is enough to consider the union of the Minkowski sum of the skin of the first polyhedron with the 1-skeleton (that is the set of edges) of the second and the sum of the skin of the second with the 1-skeleton of the first. In order to fit case 1 it is enough to span the 1-skeleton by a single path or a tree or a forest.

An example of situation 2 is the following. Assume operand $C_2$ is a <<polygon soup>>. A polygon soup is an unstructured set of triangles and pieces of triangulations, with possibly non-manifold edges and vertices. It approximately spans the boundary of a solid, meaning that it covers up this boundary unless may be for some small gaps between triangles. Let us note $\epsilon>0$ such that the largest gap does not exceed $2\epsilon$. It is possible to "heal" this polygon soup, which is to convert it into a watertight representation. First create a tetrahedron or octahedron $C_1$ large enough to contain a ball of radius $\epsilon$. Then, compute the Minkowski sum of $C_1$ with $C_2$. This operation fits situation 2 because $C_1$ is indeed a 3-manifold and the Minkowski sum with $C_2$ preserves the orientation of the tetrahedrons of $C_1$.

An example of situation 3 is the following. Assume that we want to compute the union of all the images of a solid defined by a two parameters family of transformations. It is possible to approximate the family of transformations by triangulating the 2-dimensional parameter space into a combinatorial 2-manifold $C_2$. It is possible as well to triangulate the solid into a combinatorial 3-manifold $C_1$. If the transformations and their dependence with respect to the parameters are smooth enough, simplices can be made sufficiently small to reach a given approximation of the exact map. This approximation is defined by the piecewise linear map induced on $C_1 \times C_2$; by the images of the vertices of $C_1 \times C_2$. Notice that it is not required, unlike situation 2, for the transformations to be orientation preserving, in particular a transformation may send an interior simplex on the boundary of the image.

Another example of situation 3 is the following. Assume a robot arm with n degrees of freedoms holding a solid S. The volume swept by S can be computed as follows. First triangulate the configuration space of the arm as a combinatorial n-manifold (possibly as a product of the triangulations of the configuration spaces of each join of the arm).

If n is even, triangulate S as a combinatorial 3-manifold. If S is given by its skin triangulation, this requires triangulating the solid, which is not entirely trivial if S is not convex. Another option is to triangulate a thickening of the skin, by creating an inner vertex $V_i$ for each skin vertex $V_s$, at distance $\epsilon>0$ and, if possible, with the vector $\overrightarrow{V_sV_i}$ pointing toward the interior of the solid, and then replacing each skin triangle by a thin triangular prism.

Figure 81:
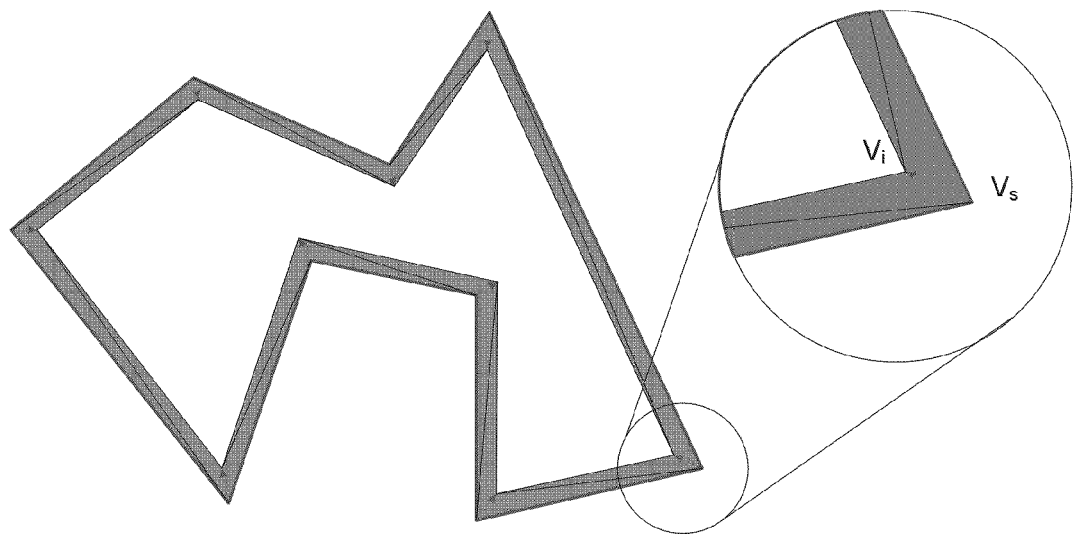
FIG. 81 is a plan view of a thickened polygon and its triangulation.

If n is odd, the skin triangulation of the solid is used. Both cases fit situation 3. FIG. 81 depicts a thickened polygon with its triangulation.

Triangulation, Tetrahedrization

As an example for obtaining a simplicial complex, a general procedure for the triangulation of the Cartesian product $C_1 \times C_2$ of two simplicial complexes $C_1$ and $C_2$, as depicted in FIG. 1 at step S30, is described here. The procedure below allows triangulating any subset of the product in a consistent way. More precisely, given a simplex $\sigma_1$ in $C_1$ and a simplex $\sigma_2$ in $C_2$, the triangulate procedure triangulates the Cartesian product $\sigma_1 \times \sigma_2$ in such a way that if $\sigma'^1$ in $C_1$ and $\sigma'^2$ in $C_2$ are respective faces of $\sigma_1$ and $\sigma_2$ (with possibly $\sigma'_1 = \sigma_1 \square_{or} \sigma'_2 = \sigma_2$ $\square$ the triangulation computed from $\sigma'_1$ and $\sigma'_2$ is compatible with the triangulation computed from $\sigma_1$ and $\sigma_2$. In other words, it is a sub-complex of the triangulation computed from $\sigma_1$ and $\sigma_2$. This procedure allows then to output any subset of the triangulation of the Cartesian product "on the fly", thus avoiding the costly triangulation of the whole Cartesian product.

The consistency condition relies on two arbitrary given total orderings, one on the set of vertices of $C_1$ and one on the set of vertices of $C_2$. Given a n-simplex $\sigma_1$ in $C_1$ and a m-simplex $\sigma_2$ in $C_2$, these total orderings induce an ordering of the vertices of the simplices of $\sigma_1$ and $\sigma_2$. Using this ordering, $\sigma_1$ and $\sigma_2$ are expressed as $\sigma_1=[x_0, \ldots, x_n]$ and $\sigma_2=[y_0, \ldots, y_m]$ where $x_0, \ldots, x_n$ and $y_0, \ldots, y_m$ are respective increasing sequences of vertices of $\sigma_1$ and $\sigma_2$.

The triangulate procedure below is called with the two input simplices $\sigma_1$ and $\sigma_2$ and an empty simplicial complex T. The procedure successively adds (n+m)-simplices to T. Faces of these simplices are not explicitly added to T. By convention, they are considered implicitly as part of the resulting complex.

A recursive triangulation procedure pseudo-code may be the following.

TRIANGULATE($[x_0, \ldots, x_n], [y_0, \ldots, y_m], T$)

Input: $\sigma_1=[x_0, \ldots, x_n]$, $\sigma_2=[y_0, \ldots, y_m]$ and an empty simplicial complex T Output: simplicial complex T triangulating the Cartesian product $\sigma_1 \times \sigma_2$

```
                If n == 0
                    Add [(x_0,y_0),...,(x_0,y_m)] to T
                Else If
                    Add [(x_0,y_0),...,(x_n,y_0)] to T
                Else
```

Initialize an empty simplicial complex $T_1$

```
    TRIANGULATE( [x_0,...,x_{n-1}], [y_0,...,y_m], T_1)
    For each (n+m-1)-simplex ⌊(x_{i_0},y_{j_0}),...,(x_{i_{n+m-1}},y_{j_{n+m-1}})⌋ in T_1 :
        Add ⌊(x_{i_0},y_{j_0}),...,(x_{i_{n+m-1}},y_{j_{n+m-1}}),(x_n,y_m)⌋ to T
    EndFor
```

Initialize an empty simplicial complex $T_2$

```
    TRIANGULATE([x_0,...,x_n], [y_0,...,y_{m-1}], T_2)
    For each (n+m-1)-simplex ⌊(x_{i_0},y_{j_0}),...,(x_{i_{n+m-1}},y_{j_{n+m-1}})⌋ in T_2 :
        Add ⌊(x_{i_0},y_{j_0}),...,(x_{i_{n+m-1}},y_{j_{n+m-1}}),(x_n,y_m)⌋ to T
    EndFor
EndIf
```

Figure 82:
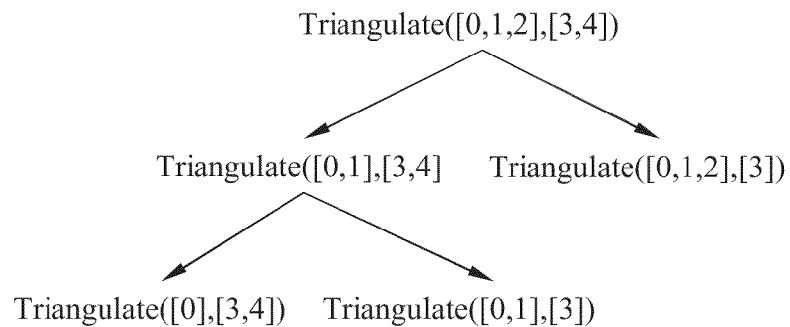
FIGS. 82-87 are schematic views illustrating the triangulation procedure of the present invention.

How the triangulation procedure works is illustrated below with a triangle $\sigma_1=[0,1,2]$ and a line segment $\sigma_2=[3,4]$. For simplicity, vertices names use integer numbers representing the absolute ordering. The recursion first navigates down to the deepest calling level until one of the two input simplices is a 0-simplex. FIG. 82 depicts this step.

Figure 83:
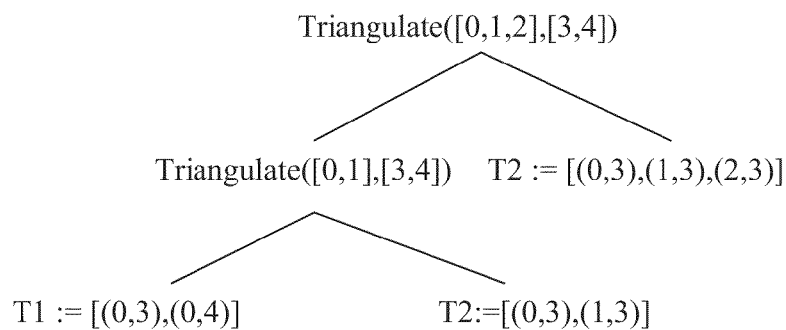

Next step (see FIG. 83) is to perform the easy products of a simplex by a 0-simplex at each leaf node of the calling tree. Resulting simplices are stored in $T_1$ and $T_2$.

Figure 84:
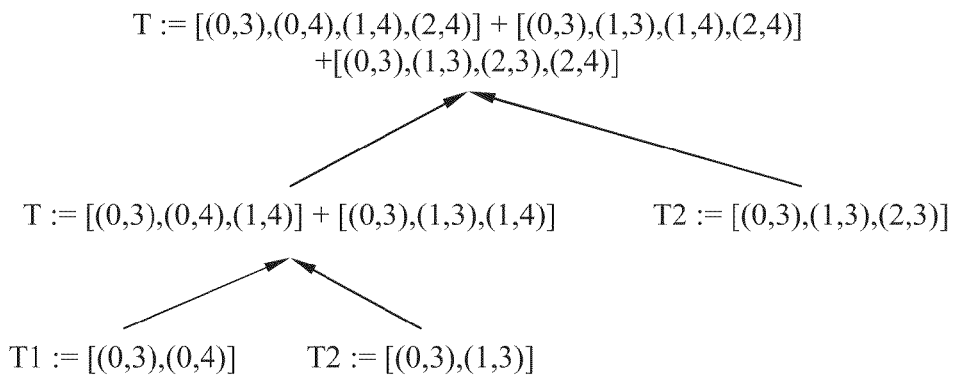

Then, partial simplices stored in $T_1$ and $T_2$ are combined at upper level (see FIG. 84).

Figure 85:
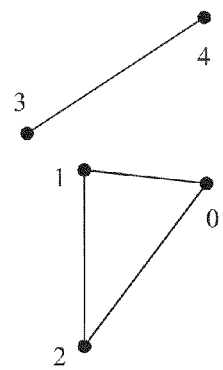
Figure 86:
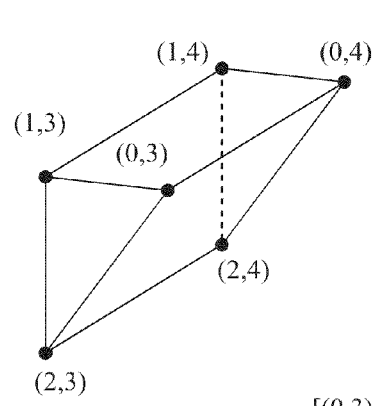
Figure 87:
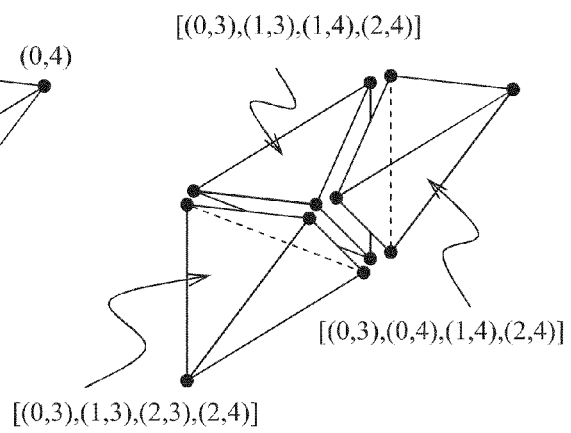

This yields the geometry shown in FIGS. 85-87. From left on FIG. 85 to right on FIG. 87: input simplices $\sigma_1=[0,1,2]$ and $\sigma_2=[3,4]$, Cartesian product $\sigma_1 \times \sigma_2$ (which is a prism), the output triangulation T of the Cartesian product by three tetrahedrons.

The resulting simplicial complex T is defined by three adjacent tetrahedrons. The final step of the triangulation procedure is to complete the combinatorial description of T by adding triangles, edges and vertices. This step is not further described.

Figure 88:
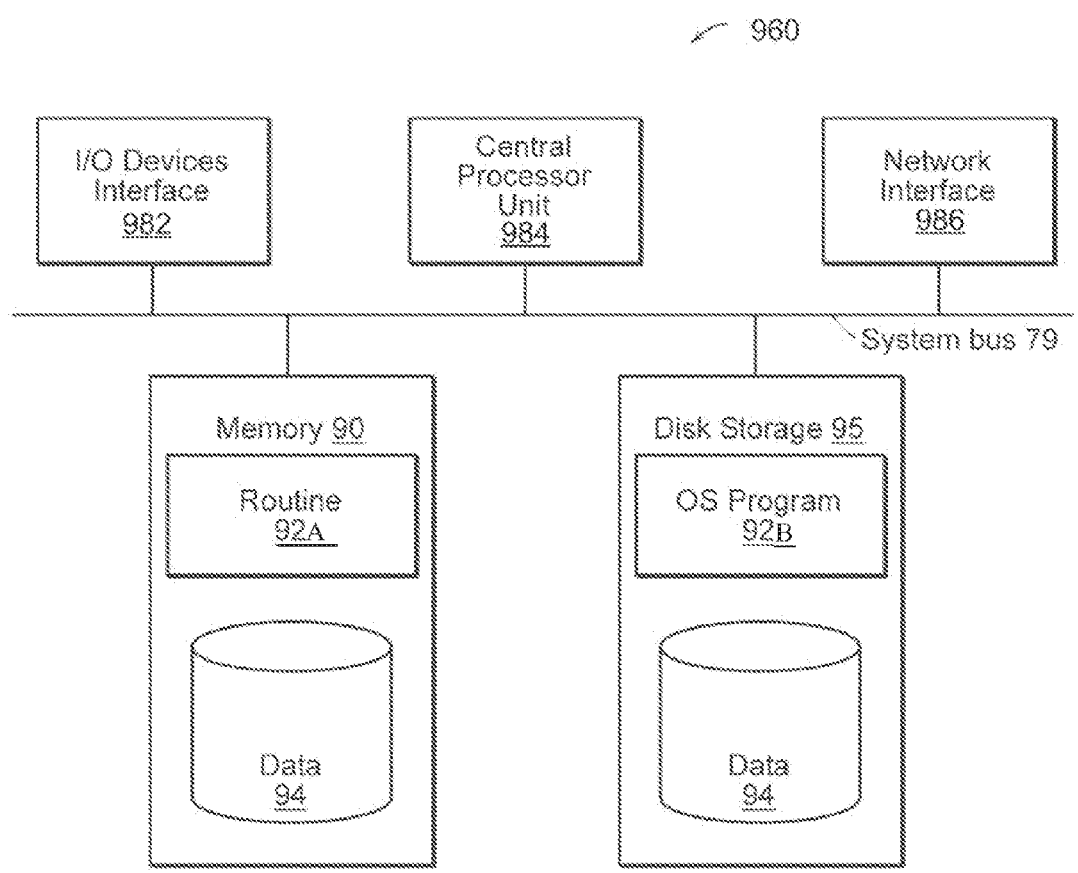
FIG. 88 is a block diagram of a computer system embodying the present invention.

The invention may advantageously be implemented in one or more computer programs 92A-B that are executable on a programmable system 960 (FIG. 88) including at least one programmable processor 984 coupled to receive data and instructions from, and to transmit data and instructions to, a data storage system 90,95 at least one input device, and at least one output device. A system bus 79 provides the set of hardware lines for data transfer among these components of computer system 960. Attached to the system bus 79 is I/O device interface 982 for connecting various input and output devices (e.g., keyboard, mouse, displays, printers, speakers, etc.) to computer 960. Network interface 986 allows the computer system to connect to various other computers or devices attached to a network of computers (e.g., a local area network, a wide area network, a global computer network such as the Internet, and the like). Memory 90 provides volatile storage for computer software instructions 92A and data 94 used to implement an embodiment of the present invention (e.g., steps and procedures of FIGS. 1 and 2 and supporting code detailed above). Disk 95 provides non-volatile storage for computer software instructions 92B and data 94 used to implement an embodiment of the present invention. Central processor unit 984 is also attached to system bus 79 and provides for the execution of computer instructions.

The application program may be implemented in a high-level procedural or object-oriented programming language or in assembly or machine language if desired; and in any case, the language may be a compiled or interpreted language.

Generally, processor 984 receives instructions and data from a read-only memory and/or a random access memory 90. Storage devices suitable for tangibly embodying computer program instructions 92A-B and data 94 include all forms of nonvolatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially designed ASICs (application-specific integrated circuits).

While this invention has been particularly shown and described with references to example embodiments thereof, it will be understood by those skilled in the art that various changes in form and details may be made therein without departing from the scope of the invention encompassed by the appended claims.

For example, the preferred embodiment of the present invention has been described. It will be understood that various modifications may be made without departing from the spirit and scope of the invention. Therefore, other implementations are within the scope of the following claims.

Although the method and routines described herein above are described in a naïve manner, for the sake of pedagogy, it is obvious that improvements can be contemplated with respect to algorithm efficiency considerations.

What is claimed is:

1. A computer-implemented method of computing, in a computer aided design system, a boundary of a modeled object, the method comprising:
   (a) computing a simplicial product by:
      accessing data defining a polyhedral profile and a polyhedral trajectory;
      computing a Cartesian product from said polyhedral profile and the said polyhedral trajectory; and
      carrying out a generalized triangulation of the computed Cartesian product;
   (b) accessing data defining a modeled object as a simplicial m-complex, the said simplicial m-complex being at least one of the computed simplicial product, a simplicial product of a polyhedral profile of a given object by a sequence of translations and/or transformations and a simplicial product of a polyhedral profile of a given object by a simplicial complex in a space of translations and/or transformations;
   (c) projecting the simplicial m-complex in $\Re^n$, $m \geq n$; and
   (d) computing a polyhedral boundary of said modeled object as a polyhedral n−1-cycle in the projection of the simplicial complex, the polyhedral n−1-cycle substantially bordering the projection of the simplicial complex.

2. The method of claim 1, wherein at the step of computing, the polyhedral n−1-cycle comprises simplices of the projection of the simplicial complex.

3. The method of claim 2, wherein n=3 and the step of computing a polyhedral boundary comprises:
   testing triangles of the projection of the simplicial complex, wherein testing said triangles comprises, for each of the triangles tested, testing whether simplex cofaces of the triangle tested are on the same side of said each of the triangles tested.

4. The method of claim 1, wherein said simplicial product is representative of a space swept by said polyhedral profile along said simplicial complex in the space of translations and/or transformations.

5. The method of claim 4, wherein said simplicial complex in the space of translations and/or transformations is a 3D polyhedron in the space of translations and/or transformations.

6. The method of claim 1, wherein said simplicial complex in a space of translations and/or transformations is a k-dimensional complex product of k sequences of translations and/or transformations.

7. The method of claim 1, wherein the simplicial product is representative of a space swept by said profile along said sequence.

8. A non-transitory computer readable medium having computer program instructions stored thereon for computing a boundary of a modeled object, that when executed by a computer, they cause said computer to take the steps of:
(a) computing a simplicial product by:
accessing data defining a polyhedral profile and a polyhedral trajectory;
computing a Cartesian product from the said polyhedral profile and the said polyhedral trajectory; and
carrying out a generalized triangulation of the computed Cartesian product;
(b) accessing data defining a modeled object as a simplicial m-complex, the said simplicial m-complex being the computed simplicial product;
(c) projecting the simplicial m-complex in $\Re^n$, $m \geq n$; and
(d) computing a polyhedral boundary of said modeled object as a polyhedral n–1-cycle in the projection of the simplicial complex, the polyhedral n–1-cycle substantially bordering the projection of the simplicial complex.

9. The computer readable medium of claim 8, wherein, at the step of computing, the polyhedral n–1-cycle comprises simplices of the projection of the simplicial complex.

10. The computer readable medium of claim 9, wherein n=3 and the step of computing a polyhedral boundary comprises:
testing triangles of the projection of the simplicial complex, wherein testing said triangles comprises, for each of the triangles tested, testing whether simplex cofaces of the triangle tested are on the same side of said each of the triangles tested.

11. An apparatus for computing, in a computer aided design system, a boundary of a modeled object, the apparatus comprising:
a memory storing a processor routine;
a processor configured to execute the processor routine, the processor routine when executed computing a simplicial product by:
accessing data defining a polyhedral profile and a polyhedral trajectory;
computing a Cartesian product from the said polyhedral profile and the said polyhedral trajectory;
carrying out a generalized triangulation of the computed Cartesian product;
accessing data defining a modeled object as a simplicial m-complex, the said simplicial m-complex being the computed simplicial product;
projecting the simplicial m-complex in $\Re^n$, $m \geq n$; and
computing compute a polyhedral boundary of said modeled object as a polyhedral n–1-cycle in the projection of the simplicial complex, the polyhedral n–1-cycle substantially bordering the projection of the simplicial complex.

12. The apparatus of claim 11, wherein the polyhedral n–1-cycle comprises simplices of the projection of the simplicial complex.

13. The apparatus of claim 12, wherein n=3 and the processor adapted to compute a polyhedral boundary comprises:
testing triangles of the projection of the simplicial complex, wherein testing said triangles comprises, for each of the triangles tested, testing whether simplex cofaces of the triangle tested are on the same side of said each of the triangles tested.

* * * * *

UNITED STATES PATENT AND TRADEMARK OFFICE
CERTIFICATE OF CORRECTION

PATENT NO.         : 8,280,698 B2                                                   Page 1 of 1
APPLICATION NO.    : 12/610016
DATED              : October 2, 2012
INVENTOR(S)        : Nicolas Montana, Frédéric Chazal and André Lieutier It is certified that error appears in the above-identified patent and that said Letters Patent is hereby corrected as shown below:

In Column 24, Claim 11, line 26 delete "compute"

Signed and Sealed this
Twentieth Day of November, 2012

David J. Kappos
*Director of the United States Patent and Trademark Office*